United States Patent

Kojima et al.

[11] Patent Number: 5,659,582
[45] Date of Patent: Aug. 19, 1997

[54] RECEIVER, AUTOMATIC GAIN CONTROLLER SUITABLE FOR THE RECEIVER, CONTROL SIGNAL GENERATOR SUITABLE FOR THE AUTOMATIC GAIN CONTROLLER, RECEPTION POWER CONTROLLER USING THE AUTOMATIC GAIN CONTROLLER AND COMMUNICATION METHOD USING THE RECEIVER

[75] Inventors: Toshiharu Kojima; Tatsuya Uchiki, both of Kamakura, Japan

[73] Assignee: Mitsubishi Denki Kabushiki Kaisha, Tokyo, Japan

[21] Appl. No.: 394,796

[22] Filed: Feb. 27, 1995

[30] Foreign Application Priority Data

Feb. 28, 1994 [JP] Japan .................................. 6-030269
Dec. 28, 1994 [JP] Japan .................................. 6-326954

[51] Int. Cl.$^6$ .......................................... H04B 1/06
[52] U.S. Cl. .................................. 375/345; 455/234.1
[58] Field of Search ................. 375/345; 455/234.1, 455/239.1, 240.1, 245.1, 249.1, 250.1; 329/350; 330/254, 129

[56] References Cited

U.S. PATENT DOCUMENTS 4,807,035  2/1989  Sayliss ................................ 358/174
4,935,814  6/1990  Omoto ................................. 358/139
5,301,364  4/1994  Aiens et al. ........................... 455/69
5,496,488  3/1996  Morgan et al. ......................... 607/30

FOREIGN PATENT DOCUMENTS 5-75664  3/1993  Japan.

OTHER PUBLICATIONS

Tseyoshi, Digital Filter Design, Jan. 25, 1986, pp. 22–23, 44–45.

Primary Examiner—Stephen Chin
Assistant Examiner—Kevin Kim
Attorney, Agent, or Firm—Wolf, Greenfield & Sacks P.C.

[57] ABSTRACT

A receiver, an automatic gain controller suitable for the receiver, a control signal generator suitable for the automatic gain controller, a reception power controller using the automatic gain controller and a communication method using the receiver. The instantaneous power of a received signal output from a variable gain amplifier or attenuator is detected by a power detector. The detected instantaneous power is quantized by a comparator and filtered through a random walk filter. An up-down counter counts up or down in accordance with the increment signal or the decrement signal obtained by filtering. In this manner, error in the gain control of the variable gain amplifier or attenuator is obtained.

30 Claims, 34 Drawing Sheets

RECEIVER, AUTOMATIC GAIN CONTROLLER SUITABLE FOR THE RECEIVER, CONTROL SIGNAL GENERATOR SUITABLE FOR THE AUTOMATIC GAIN CONTROLLER, RECEPTION POWER CONTROLLER USING THE AUTOMATIC GAIN CONTROLLER AND COMMUNICATION METHOD USING THE RECEIVER

BACKGROUND OF THE INVENTION

1. Field of the Invention

The present invention relates to an automatic gain controller (hereinunder referred to as "AGC") in which a digital filter having a complicated structure is dispensed with. The present invention also relates to a receiver using the AGC. The present invention also relates to a control signal generator suitable to the AGC. The present invention also relates to a reception power controller using the AGC. In addition, the present invention relates to a communication method using the receiver.

2. Description of the Prior Art

FIG. 33 shows the structure of a conventional AGC. The circuit shown in FIG. 33 is substantially disclosed in, for example, Japanese Patent Laid-Open No. Hei 5-75664.

A variable gain amplifier 10 amplifies a received signal and supplies the amplified signal to a demodulator 12. The demodulator 12 performs the quadrature-phase detection of the amplified received signal and outputs the complex baseband signal obtained to a baseband circuit (not shown) and a square-sum calculator 14. The complex baseband signal is composed of an in-phase component I and a quadrature-phase component Q. The square-sum calculator 14 calculates the square-sum of the in-phase component I and a quadrature-phase component Q, i.e., the instantaneous reception power p from the following formula:

$$p = I^2 + Q^2$$

A digital filter 16 obtains an average reception power by filtering the square sum. If it is assumed that the received signal is an MSK (Minimum Shift Keying) modulated signal, since the MSK modulated wave has a constant envelope level, the average reception power obtained by the digital filter 16 is stable and does not change rapidly. It is therefore possible to balance the feedback loop shown in FIG. 33 so that the reception power output from the variable gain amplifier 10 is constant irrespective of the reception power input to the variable gain amplifier 10 by controlling the gain on the basis of the average reception power obtained so as to decrease when the average reception power is large and increase when the average reception power is small. As a result, the power of the complex baseband signal output from the demodulator 12 becomes constant, so that the processing by the baseband circuit at the subsequent stage becomes stable.

The digital filter 16 has a structure such as that shown in FIG. 34. In FIG. 34, the instantaneous reception power p of an input series and the output of a delay element 20 are input to an adder element 18. The adder element 18 adds the instantaneous reception power p and the output of the delay element 20. The output of the adder element 18 is delayed by one sampling period T by the delay element 20, and the delayed output is multiplied by a tap coefficient by a multiplier element 22. Thereafter, the thus-obtained output is input again to the adder element 18. In this manner, the output series $Y_i$ obtained from the adder element 18 is a value obtained by filtering the instantaneous reception power p through a low pass filter, in other words, an average reception power as represented by the following formula:

$$y_i = x_i - b y_{i-1}$$

wherein i represents a time, $x_i$ an input series and $-b$ a tap coefficient. The filter having this structure is called a first order infinite impulse response (first order IIR) filter.

The unit impulse response $h_i$ of the filter, that is, the output series $y_i$ of the digital filter 16 when the unit impulse is given as the input series $x_i$ when the time t=0 is shown in FIG. 35 on the assumption that $b = -e^{-T/\tau}$. In other words, the unit impulse response $h_i$ is obtained by discretizing the unit impulse response of the analog CR filter of the time constant t in the time domain. The characteristic of the digital filter 16 can be changed by changing b.

A more general structure of the digital filter 16 is shown in FIG. 36. In FIG. 36, the input series to an adder element 24 and the output series from the adder element 24 have a multiplicity of bits, and each output series from the adder element 24 is delayed by a clock period T by each of a multiplicity of cascaded delay elements 28 to 33. Each of the output series from the delay elements 28 to 33 is multiplied by the tap coefficient by multiplier elements 34 to 40, and each of the output series from the multiplier elements 34 to 40 is added to the input series by the adder element 24. Each of the output series of the delay elements 28 to 33 is multiplied by the tap coefficient by multiplier elements 42 to 48, and each of the output series of the multiplier elements 42 to 48 is added to the output series from the adder element 24 by an adder element 26. In other words, the structure shown in FIG. 36 is that of an n-order IIR filter.

The AGC having the above-described structure, however, produces various problems when the dynamic range of a received signal is as wide as, for example, several ten dB. In the case of applying the above-described AGC to a received signal having a wide dynamic range, it is necessary to greatly increase the bit number of the input series $x_i$ of the digital filter 16, for example, to about several ten bits. In the filter having such a structure, the number of taps (tap number) becomes so large that when the filter is implemented as hardware, problems such as an increase in the circuit scale and an increase in power consumption are caused, and when the filter is implemented as software, problems such as a high processing load are caused.

The above-described AGC is suitable for use in a modulation system such as an MSK in which the envelope level of the modulated wave is constant, but it is not suitable to a modulation system such as a QPSK (Quadrature Phase Shift Keying) in which the envelope level of the modulated wave is not constant. If the AGC shown in FIG. 33 using a filter having a small number of taps as shown in FIG. 34 as the digital filter 16 is applied to the automatic gain control of a QPSK demodulated wave, the feedback loop from the demodulator 12 to the variable gain amplifier 10 via the square-sum calculator 14 and the digital filter 16 inconveniently oscillates. This is because the cut off frequency of the digital filter 16 is so high that when the envelope level changes, the component having a comparatively high frequency passes through the digital filter 16. If the AGC shown in FIG. 33 using a filter having a large number of taps as shown in FIG. 36 as the digital filter 16, is applied to the automatic gain control of a QPSK demodulated wave, the responsiveness of the feedback loop is deteriorated so much that the high-speed response required at the start of communication or the like is not realized. This is because the responsiveness of the digital filter 16 is deteriorated due to the low cut-off frequency of the digital filter 16.

FIG. 37 shows another conventional structure of the automatic gain controller substantially disclosed in Japanese Patent Laid-Open No. Hei 3-254510. In FIG. 37, an A/D converter 50 for converting the amplified received signal into the digital signal is provided. An amplitude converter 52 converts the digital signal into the absolute valve thereof, and a square-sum calculator 54 calculates the square sum of the absolute valve. Thus, the average reception power is obtained from the square-sum calculator 56. A control signal generator 56 generates the control signal for the variable gain amplifier 10 on the basis of the average reception power so that the deviation from the control target is cancelled and, hence, the feedback loop is balanced.

In this conventional structure, however, the long pull-in time is required when the deviation represented in dB has a positive value and the astable operation occurs when the deviation represented in dB has a negative value, because the average reception power represented by the linear scale is used for controlling the gain. For example, in the case that the target equals 100 as the linear scale, the levels represented as +3dB and −3dB on the logarithm scale are represented as 200 and 50 on the linear scale, respectively. In the prior art, since the linear scale is used, the absolute value of the control signal for cancelling the +3 dB deviation becomes 2 times as large as that for cancelling the −3 dB deviation. This causes the long pull-in time for the +3dB deviation and astable operation for the −3 dB deviation.

To overcome the problem, a log-converter or a log-amplifier may be provided between the control signal generator and the variable gain amplifier. However, providing the log-converter or the log-amplifier results in an enlarged and complicated circuit.

SUMMARY OF THE INVENTION

Accordingly, it is a first object of the present invention to solve the above-described problems in the prior art and to dispense with a digital filter which greatly increases the circuit scale or the amount of information processing with an increase in the tap number.

It is a second object of the present invention to reduce the circuit scale, the power consumption and the processing load..

It is a third object of the present invention to provide an AGC which is suitable to use in both a modulation system such as an MSK, in which the envelope level of the modulated wave is constant, and in a modulation system such as a QPSK in which the envelope level of the modulated wave is not constant.

It is a fourth object of the present invention to prevent oscillation of the feedback loop of an AGC.

It is a fifth object of the present invention to improve the responsiveness of the feedback loop of an AGC and to realize the high-speed responsiveness required at the start of communication or the like.

It is a sixth object of the present invention to prevent a change in the behavior of an AGC and, hence, the oscillation or the like due to a minute change in the instantaneous reception power.

It is a seventh object of the present invention to enable the responsiveness of an AGC to be automatically switched.

It is an eighth object of the present invention to enable the transmission power to be appropriately automatically controlled.

It is a ninth object of the present invention to enable the direction of the antenna to be initially set appropriately. It is a tenth object of the present invention to enable the dB value of reception power to be detected. It is an eleventh object of the present invention to enable the dB value of reception power to be detected by a simple structure.

It is a twelfth object of the present invention to shorten the pull-in time and to stabilize the pull-in operation without using a log-converter, a log-amplifier or the like.

To achieve this aim, in a first aspect of the present invention there is provided an AGC for controlling the gain of a gain controllable device so that the power of a signal amplified or attenuated. by the gain control device is constant, the AGC comprising:

a) power detecting means for detecting the instantaneous power of the signal amplified or attenuated by the gain controllable device;

b) integrating means for producing an integrated power by integrating the instantaneous power;

c) smoothing means for forcibly resetting the integrated power to a reference value between an upper threshold, which is predetermined, and a lower threshold, which is predetermined and smaller than the upper threshold, when the integrated power reaches the upper threshold or a lower threshold so that there is no fluctuation in the integrated power beyond a predetermined range; and d) controlling means for obtaining the trend of change of the instantaneous power by detecting that the integrated power has reached the upper threshold or the lower threshold and controlling the gain of the gain controllable device in correspondence with the trend of change obtained.

In a second aspect of the present invention, there is provided a control signal generator for controlling the gain of a gain controllable device on the basis of the instantaneous power of a signal amplified or attenuated by the gain controllable device so that the power of the signal is constant, the control signal generator comprising:

a) integrating means for producing an integrated power by integrating the instantaneous power;

b) smoothing means for forcibly resetting the integrated power to a reference value between an upper threshold which is predetermined and a lower threshold which is predetermined and smaller than the upper threshold when the integrated power reaches the upper threshold or the lower threshold so that there is no fluctuation in the integrated power beyond a predetermined range; and c) controlling means for obtaining the trend of change of the instantaneous power by detecting that the integrated power has reached the upper threshold or the lower threshold and controlling the gain of the gain controllable device in correspondence with the trend of change obtained.

In a third aspect of the present invention, there is provided a reception power controller for controlling the power of a received signal so that the reception power is constant, the reception power controller comprising:

a) a gain controllable device for amplifying or attenuating the received signal;

b) power detecting means for detecting the instantaneous power of the signal amplified or attenuated by the gain controllable device;

c) integrating means for producing an integrated power by integrating the instantaneous power;

d) smoothing means for forcibly resetting the integrated power to a reference value between an upper threshold, which is predetermined and a lower threshold which is predetermined and smaller than the upper threshold when the integrated power reaches the upper threshold or the lower threshold so that there is no fluctuation in the integrated power beyond a predetermined range; and e) controlling means for obtaining the trend of change of the instantaneous power by detecting that the integrated power has reached the upper threshold or the lower threshold and controlling the gain of the gain controllable device in correspondence with the trend of change obtained.

In a fourth aspect of the present invention, there is provided a receiver comprising:

a) receiving means for receiving a signal modulated in accordance with a predetermined modulation system;

b) power controlling means for amplifying or attenuating a received signal; and c) AGC means for controlling the gain of the power controlling means so that the power of an amplified or attenuated signal is constant, the AGC means including:

c1) power detecting means for detecting the instantaneous power of the amplified or attenuated signal;

c2) integrating means for producing an integrated power by integrating the instantaneous power;

c3) smoothing means for forcibly resetting the integrated power to a reference value between an upper threshold which is predetermined and a lower threshold which is predetermined and smaller than the upper threshold when the integrated power reaches the upper threshold or the lower threshold so that there is no fluctuation in the integrated power beyond a predetermined range; and c4) controlling means for obtaining the trend of change of the instantaneous power by detecting that the integrated power has reached the upper threshold or the lower threshold and controlling the gain of the power controlling means in correspondence with the trend of change obtained.

In the present invention, the instantaneous power of an amplified or attenuated signal from a gain controllable device such as a variable gain amplifier or attenuator is first integrated. The integrated power obtained is supplied to the smoothing means. The smoothing means limits the upper and lower integrated power values so as to prevent a fluctuation in the integrated power beyond a predetermined range. For example, when the integrated power has reached the predetermined upper threshold, the integrated power is forcibly reset to the reference value. In the same way, when the integrated power has reached the predetermined lower threshold, the integrated power is also forcibly reset to the reference value. By this processing, namely, by random walk filtering, the integrated power is smoothed. The controlling means detects that an integrated power has reached the upper or lower threshold and thereby obtains the trend of change of the instantaneous power. The gain is controlled on the basis of the trend of change obtained.

As described above, the present invention adopts not a digital filter which sets or changes the response (delay, cut-off frequency, etc.) of the digital filter by setting or changing the tap number but a random walk filter which sets or changes the response by setting or changing the upper or lower threshold. The random walk filter, which is composed of the integrating means and the smoothing means, does not increase the circuit scale or the amount of information processing even the upper and lower thresholds are changed, as is clear from the above explanation. Therefore, it is not necessary to use a digital filter such as an IIR filter and an FIR (finite impulse response) filter in which the circuit scale or the amount of information processing greatly increases with an increase in the tap number. As a result it is possible to realize a reduction in the circuit scale, the power consumption and the processing load.

The power detecting means may be composed of either a digital circuit or an analog circuit. When it is a digital circuit, an A/D converter and a square calculator are used. The arrangement of these elements is not specified, but by using these elements, a digital signal which indicates the instantaneous power of an amplified signal is obtained. If the power detecting means is an analog circuit, a square detector element such as a diode is used and further an RC integrating circuit or the like is used. Whether the power detecting means is a digital circuit or an analog circuit, the structure is very simple. In both cases, the integrating means at the subsequent stage can be realized by an up-down counter and the smoothing means can be realized by a comparator and a logical OR. The controlling means in this case can be realized by an up-down counter which counts up when the integrated power exceeds the upper threshold while counting down when the integrated power is below the lower threshold.

When the detected instantaneous power is supplied to the integrating means, it is quantized. If the power detecting means is a digital circuit, a digital comparator is used as the quantizing means. On the other hand, if the power detecting means is an analog circuit, an analog comparator is used as the quantizing means. At the time of quantizing, only one quantizing threshold may be used or a plurality of quantizing thresholds may be prepared. When a single quantizing threshold is used, the integrated power is obtained by either counting up or counting down in accordance with the sign of the quantized integrated power.

When a plurality of quantizing thresholds are prepared, the integrating means is composed of an up-down counter which counts up or down on the basis of the result of the quantization for each quantizing threshold by the corresponding comparator. Preparing a plurality of quantizing thresholds is advantageous in that it is possible to provide the integrating means with a dead zone and that it is possible to realize an AGC which is suitable both to a modulation system such as an MSK in which the envelope level of the modulated wave is constant and to a modulation system such as a QPSK in which the envelope level of the modulated wave is not constant. More specifically, since the integrated power does not change when the value of the detected instantaneous reception power is between a plurality of quantizing thresholds, the AGC does not become unstable due to a fluctuation in the envelope level. Therefore, even if the interval between the upper threshold and the lower threshold is set at a small value (i.e., even if the cut-off frequency is high), it is possible to prevent the oscillation of the feedback loop.

In addition, by setting the interval between the upper threshold and the lower threshold at a large value, it is possible to improve the responsiveness of the feedback loop of the AGC and realize a high-speed response which is required at the start of communication or the like. Even if only a single quantizing threshold is used, it is possible to make a change in the integrated power corresponding to a change in the instantaneous power, small, by appropriately setting the quantizing threshold. In this way, the AGC is unlikely to become unstable due to a fluctuation in the envelope level. However, it is necessary to take note of the fact that the responsiveness of the AGC is sometimes deteriorated out of the range in which a fluctuation of the envelope level of a modulated wave matters.

It is possible to set the response of the random walk filter by setting the upper threshold and the lower threshold. It is therefore possible to automatically switch the response of the AGC by sequentially changing the upper threshold and the lower threshold. In this case, it is necessary to change the reference value also which is to be defined by the correlation between the upper threshold and the lower threshold. The associative setting or switching are realized by, for example, processing including the steps of providing a reference value by a response switching signal, providing an upper threshold by multiplying the value of the response switching signal by a predetermined value, and setting the lower threshold at a constant the absolute value of which is adequately small, for example, zero.

In the present invention, the quantizing means may be comprised of the dynamic range dividing means. The dynamic range dividing means compares the instantaneous power with a plurality of thresholds. By setting the thresholds so that a plurality of sub-ranges each having a predetermined equal range on a log-scale are provided, the gain control characteristics including linear-to-log conversion, can be implemented without using a log-converter or a log-amplifier.

In the present invention, the control characteristics of the gain controllable device are set at log-linear control characteristics. In this way, the trend of change obtained by the controlling means becomes the dB value of the reception power. It is therefore possible to inform an external equipment of the reception power as the dB value.

In the present invention, the control characteristics of the gain controllable device are set at characteristics other than log-linear control characteristics. In this case, it is also possible to obtain the trend of change obtained by the controlling means as the dB value of the reception power. For example, it is possible to correct the characteristics of the gain of the gain controllable device with respect to the trend of change obtained by the controlling means to log-linear characteristics by compensating the difference between the log-linear characteristics and the control characteristics of the gain controllable device. The means for compensation is realized by a ROM or the like which stores the trend of change obtained by the controlling means and the difference between the log-linear characteristics and the control characteristics of the gain controllable device in correspondence with each other. In this way, it is possible to detect the dB value of the reception power by using a cheaper gain controllable device having no log-linear characteristics. This compensation method can be generally adopted when it is necessary to correct the characteristics of the gain of the gain controllable device to desired control characteristics.

The amplifier as an object of the gain control in the present invention may be one of the plurality of cascaded amplifiers. The amplifier producing an output as an object of the power detection may also be one of the plurality of cascaded amplifiers. The latter amplifier must be the same as the former amplifier or the amplifier at the subsequent stage. It goes without saying that the power is not detected directly from the output of the amplifier and that a demodulator or a frequency converter may be inserted therebetween.

In a fifth aspect of the present invention, there is provided an automatic gain controller for controlling the gain of a gain controllable device so that the power of a signal amplified by the gain controllable device is constant, the automatic gain controller comprising:

(a) power detecting means for detecting an instantaneous power of the signal amplified or attenuated by the gain controllable device;

(b) comparing means for comparing the instantaneous power with a plurality of thresholds which are set so that a plurality of sub-ranges, each having a predetermined equal range on a log-scale, are provided;

(c) decoding means for generating a sub-range signal indicative of one of the plurality of sub-ranges to which the instantaneous power belongs, in accordance with a result of comparison;

(d) integrating means for producing an integrated power by integrating the sub-range signal; and (e) controlling means for controlling the gain of the gain controllable device in accordance with the integrate power.

In the present invention, the control of the power to be transmitted is executed by utilizing the trend of change obtained by random walk filtering or by sub-range dividing. According to the present invention, since the received power is detected stably irrespective of the modulation system, it is possible to automatically adjust the power to be transmitted by utilizing the received power. The means for increasing or reducing the power to be transmitted can be realized by comparators for comparing different thresholds with the trend of change.

In a sixth aspect of the present invention, there is provided a control signal generator for controlling the gain of a gain controllable device on the basis of the instantaneous power of a signal amplified or attenuated by the gain controllable device so that the power of the signal is constant, the control signal generator comprising:

(a) comparing means for comparing the instantaneous power with a plurality of thresholds which are set so that a plurality of sub-ranges, each having a predetermined equal range on a log-scale, are provided;

(b) decoding means for generating a sub-range signal indicative of one of the plurality of sub-ranges to which the instantaneous power belongs, in accordance with a result of comparison;

(c) integrating means for producing an integrated power by integrating the sub-range signal; and (d) controlling means for controlling the gain of the gain controllable device in accordance with the integrated power.

In the present invention, the beam direction of the antenna is set by utilizing the trend of change obtained by random walk filtering or by sub-range dividing. According to the present invention, since the received power is detected stably irrespective of the modulation system, it is possible to automatically set the beam direction, for example, the azimuth of the antenna, for example, immediately after the start of reception by utilizing the received power. The beam direction in which the power of the received signal is at its maximum is obtained by scanning the beam direction of the antenna in a predetermined angle range so as to obtain the trend of change prior to the start of reception, and collecting the trend of change as the data indicating the power of the received signal in correspondence with the scanned beam direction. At the time of reception, the data on the beam direction in which the power of the received signal is at its maximum is selected from the collected data and the beam direction of the antenna is controlled with the data as the control target.

In a seventh aspect of the present invention, there is provided a communication method comprising the steps of:

(a) receiving a signal modulated in accordance with a predetermined modulation system;

(b) amplifying or attenuating a received signal;

detecting an instantaneous power of an amplified or attenuated signal;

(c) producing an integrated power by integrating the instantaneous power;

(d) smoothing means for forcibly resetting the integrated power to a reference value between an upper threshold which is predetermined and a lower threshold which is predetermined and smaller than the upper threshold when the integrated power reaches the upper threshold or the lower threshold so that there is no fluctuation in the integrated power beyond a predetermined range;

(e) obtaining a trend of change of the instantaneous power by detecting that the integrated power has reached the upper threshold or the lower threshold and controlling a gain at which the received signal is amplified or attenuated in correspondence with the trend of change obtained so that the power of the amplified signal is constant; and (f) demanding a transmitter to increase or reduce the power to be transmitted on the basis of the trend of change obtained so as to suppress a fluctuation in the power of the amplified or attenuated signal.

In an eighth aspect of the present invention, there is provided a control signal generator, included in a receiver, for controlling a transmission power on the basis of the instantaneous power of a received signal so that the power of the received signal is constant, the control signal generator comprising (a) integrating means for producing an integrated power by integrating the instantaneous power;

(b) smoothing means for forcibly resetting the integrated power to a reference value between an upper threshold which is predetermined and a lower threshold which is predetermined and smaller than the upper threshold when the integrated power reaches the upper threshold or the lower threshold so that there is no fluctuation in the integrated power beyond a predetermined range; and (c) controlling means for obtaining a trend of change of the instantaneous power by detecting that the integrated power has reached the upper threshold or lower threshold and controlling the transmission power in correspondence with the trend of change obtained.

In a ninth aspect of the present invention, there is provided a control signal generator, included in a receiver, for controlling a transmission power on the basis of the instantaneous power of a received signal so that the power of the received signal is constant, the control signal generator comprising:

(a) comparing means for comparing the instantaneous power with a plurality of thresholds which are set so that a plurality of sub-ranges, each having a predetermined equal range on a log-scale, are provided;

(b) decoding means for generating a sub-range signal indicative of one of the plurality of sub-ranges to which the instantaneous power belongs, in accordance with a result of comparison;

(c) integrating means for producing an integrated power by integrating the sub-range signal; and (d) controlling means for obtaining a trend of change of the instantaneous power by detecting that the integrated power has reached the upper threshold or lower threshold and controlling the transmission power in correspondence with the trend of change obtained.

In a tenth aspect of the present invention, there is provided a communication method comprising the steps of:

(a) receiving a signal modulated in accordance with a predetermined modulation system;

(b) detecting an instantaneous power of the received signal;

(c) comparing the instantaneous power with a plurality of thresholds which are set so that a plurality of sub-ranges, each having a predetermined equal range on a log-scale, are provided;

(d) generating a sub-range signal indicative of one of the plurality of sub-ranges to which the instantaneous power belongs, in accordance with a result of comparison;

(e) producing an integrated power by integrating the sub-range signal; and (f) demanding a transmitter to increase or reduce the transmission power on the basis of the integrated power so as to suppress a fluctuation in the power of the received signal.

In an eleventh aspect of the present invention, there is provided a communication method comprising the steps of:

(a) receiving a signal modulated in accordance with a predetermined modulation system;

(b) amplifying or attenuating a received signal;

(c) detecting an instantaneous power of an amplified or attenuated signal;

(d) producing an integrated power by integrating the instantaneous power;

(e) forcibly resetting the integrated power to a reference value between an upper threshold which is predetermined and a lower threshold which is predetermined and smaller than the upper threshold when the integrated power reaches the upper threshold or the lower threshold so that there is no fluctuation in the integrated power beyond a predetermined range;

(f) obtaining a trend of change of the instantaneous power by detecting that the integrated power has reached the upper threshold or the lower threshold and controlling a gain at which the received signal is amplified or attenuated in correspondence with the trend of change obtained so that a power of the amplified signal is constant; and (g) detecting a beam direction in which the power of the received signal is at its maximum by utilizing the trend of change obtained and controlling the beam direction of the antenna with a detected beam direction as a control target.

In a twelfth aspect of the present invention, there is provided a control signal generator for controlling the azimuth of a reception antenna for receiving a signal via a wireless channel on the basis of the instantaneous power of a received signal so that the power of the received signal is constant, that control signal generator comprising:

(a) integrating means for producing an integrated power by integrating the instantaneous power;

(b) smoothing means for forcibly resetting the integrated power to a reference value between an upper threshold which is predetermined and a lower threshold which is predetermined and smaller than the upper threshold when the integrated power reaches the upper threshold or the lower threshold so that there is no fluctuation in the integrated power beyond a predetermined range; and (c) controlling means for obtaining a trend of change of the instantaneous power by detecting that the integrated power has reached the upper threshold or lower threshold and controlling the azimuth in correspondence with the trend of change obtained.

In a thirteenth aspect of the present invention, there is provided a control signal generator for controlling the azimuth of a reception antenna for receiving a signal via a wireless channel on the basis of the instantaneous power of a received signal so that the power of the received signal is constant, the control signal generator comprising:

(a) comparing means for comparing the instantaneous power with a plurality of thresholds which are set so that a plurality of sub-ranges, each having a predetermined equal range on a log-scale, are provided;

(b) decoding means for generating a sub-range signal indicative of one of the plurality of sub-ranges to which the instantaneous power belongs, in accordance with a result of comparison;

(c) integrating means for producing an integrated power by integrating the sub-range signal; and (d) controlling means for obtaining a trend of change of the instantaneous power by detecting that the integrated power has reached the upper threshold or lower threshold and controlling the azimuth in correspondence with the trend of change obtained.

In a fourteenth aspect of the present invention, there is provided a communication method comprising the steps of:

(a) receiving a signal modulated in accordance with a predetermined modulation system;

(b) detecting an instantaneous power of the received signal;

(c) comparing the instantaneous power with a plurality of thresholds which are set so that a plurality of sub-ranges, each having a predetermined equal range on a log-scale, are provided;

(d) generating a sub-range signal indicative of one of the plurality of sub-ranges to which the instantaneous power belongs, in accordance with a result of comparison;

(e) producing an integrated power by integrating the sub-range signal;

(f) obtaining a trend of change of the instantaneous power by detecting that the integrated power has reached the upper threshold or the lower threshold;

(g) detecting a beam direction in which the power of the received signal is at its maximum by utilizing the trend of change obtained; and (e) controlling the beam direction of the antenna with a detected beam direction as a control target. In a fifteenth aspect of the present invention, there is provided an automatic gain controller for controlling the gain of a gain controllable device so that the power of a signal amplified or attenuated by that gain controllable device is constant, that automatic gain controller comprising:

(a) means for detecting an instantaneous power of the signal amplified or attenuated by that gain controllable device; (b) means for random walk filtering that instantaneous power; and (c) means for obtaining a trend of change of that instantaneous power on the basis of a result of the random walk filtering, and controlling the gain of that gain controllable device in accordance with that trend of change obtained.

In a sixteenth aspect of the present invention, there is provided a control signal generator for controlling the gain of a gain controllable device on the basis of the instantaneous power of a signal amplified or attenuated by that gain controllable device so that the power of the signal is constant, that control signal generator comprising:

(a) means for random walk filtering that instantaneous power; and (b) means for obtaining a trend of change of that instantaneous power on the basis of a result of the random walk filtering, and controlling the gain of that gain controllable device in accordance with that trend of change obtained.

In a seventeenth aspect of the present invention, there is provided a reception power controller for controlling the power of a received signal so that a reception power is constant, that reception power controller comprising:

(a) a gain controllable device for amplifying or attenuating that received signal;

(b) means for detecting an instantaneous power of the signal amplified or attenuated by that gain controllable device;

(c) means for random walk filtering that instantaneous power; and (d) means for obtaining a trend of change of that instantaneous power on the basis of a result of the random walk filtering, and controlling a gain of that gain controllable device in accordance with that trend of change obtained.

In an eighteenth aspect of the present invention, there is provided a receiver comprising:

(a) means for receiving a signal modulated in accordance with a predetermined modulation system;

(b) amplifying or attenuating means for amplifying a received signal; and (c) means for controlling a gain of that amplifying or attenuating means so that a power of an amplified or attenuated signal is constant, that controlling means including:

(c1) means for detecting an instantaneous power of that amplified signal;

(c2) means for random walk filtering that instantaneous power; and (c3) means for obtaining a trend of change of that instantaneous power on the basis of a result of the random walk filtering, and controlling the gain of that amplifying or attenuating means in accordance with that trend of change obtained.

In a nineteenth aspect of the present invention, there is provided a communication method comprising the steps of:

(a) receiving a signal modulated in accordance with a predetermined modulation system;

(b) amplifying or attenuating a received signal;

(c) detecting an instantaneous power of an amplified or attenuated signal;

(d) random walk filtering that instantaneous power;

(e) obtaining a trend of change of that instantaneous power on the basis of a result of the random walk filtering, and controlling the gain at which the received signal is amplified or attenuated in accordance with that trend of change obtained; and (f) demanding a transmitter to increase or reduce a power to be transmitted on the basis of that trend of change obtained so as to suppress a fluctuation in a power of the amplified or attenuated signal.

In a twentieth aspect of the present invention, there is provided a communication method comprising the steps of:

(a) receiving a signal modulated in accordance with a predetermined modulation system by using an antenna;

(b) amplifying or attenuating a received signal;

(c) detecting an instantaneous power of an amplified or attenuated signal;

(d) random walk filtering that instantaneous power;

(e) obtaining a trend of change of that instantaneous power on the basis of a result of the random walk filtering, and controlling a gain at which the received signal is amplified or attenuated in accordance with that trend of change obtained; and (f) detecting a beam direction in which a power of that received signal is at its maximum by utilizing that trend of change obtained and controlling the beam direction of that antenna with a detected beam direction as a control target.

The above and other objects, features and advantages of the present invention will become clear from the following description of preferred embodiments thereof, taken in conjunction with the accompanying drawings.

DESCRIPTION OF THE PREFERRED EMBODIMENTS

Figure 1:
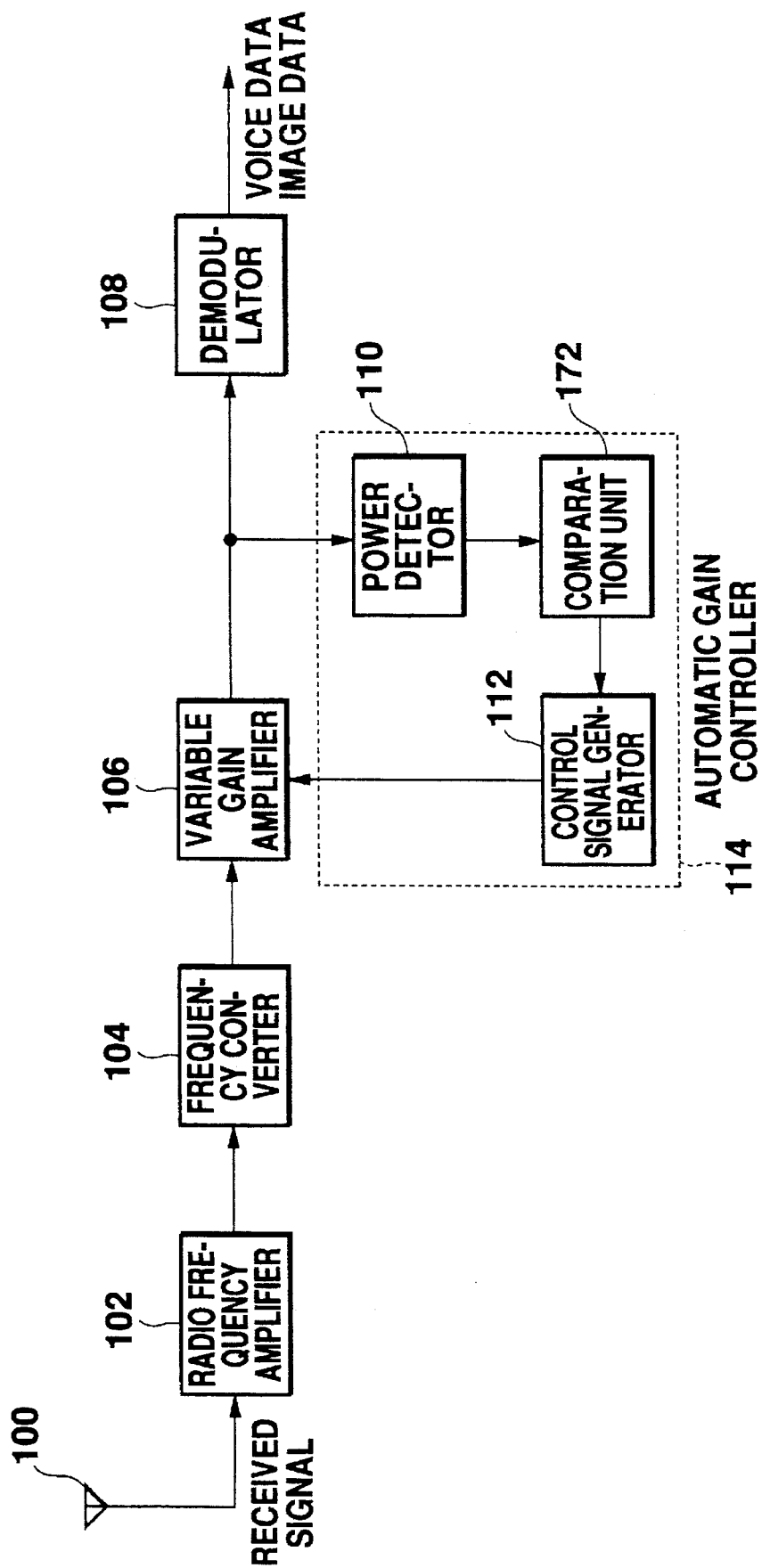
FIG. 1 is a block diagram of the structure of a first embodiment of a receiver according to the present invention.

Preferred embodiments of the present invention will be explained hereinunder with reference to the accompanying drawings. The same reference numerals are provided for the same or corresponding elements in the embodiments and explanation thereof will be omitted.

a) Structure of a Receiver

The structure of each embodiment of the present invention will be briefly explained.

a.1) First Embodiment

FIG. 1 shows the structure of a first embodiment of a receiver according to the present invention. In this embodiment, the modulated wave (received signal) received by an antenna 100 is first amplified by a radio frequency amplifier 102. The frequency of the received signal amplified by the radio frequency amplifier 102 is converted from a radio frequency to an intermediate frequency by a frequency converter 104. The received signal with the frequency converted into the intermediate frequency is amplified by a variable gain amplifier 106 and supplied to a demodulator 108. The demodulator 108 detects the received signal amplified by the variable gain amplifier 106 and reproduces the information such as voice data and image data which is transmitted on a radio wave from a transmitter.

In this embodiment, an AGC 114 composed of a power detector 110, a comparator unit 172 and a control signal generator 112 is provided as a means for controlling the gain of the variable gain amplifier and making the power of the received signal supplied to the demodulator 108 constant. The power detector 110 detects the instantaneous reception power of the received signal from the received signal output from the variable gain amplifier 106. The comparator unit 172 compares the detected power with a predetermined threshold or a set of predetermined thresholds. The control signal generator 112 generates a control signal on the basis of the result of the comparator, and controls the gain of the variable gain amplifier 106 by using the control signal generated. The control signal generator 112 so controls the gain as to be decreased when the instantaneous reception power is increased and to be increased when the instantaneous reception power is decreased. In this manner, the power of the received signal output from the variable gain amplifier 106 is converged on a predetermined equilibrium value irrespective of the power of the received signal input to the variable gain amplifier 106.

a.2) Second Embodiment

Figure 2:
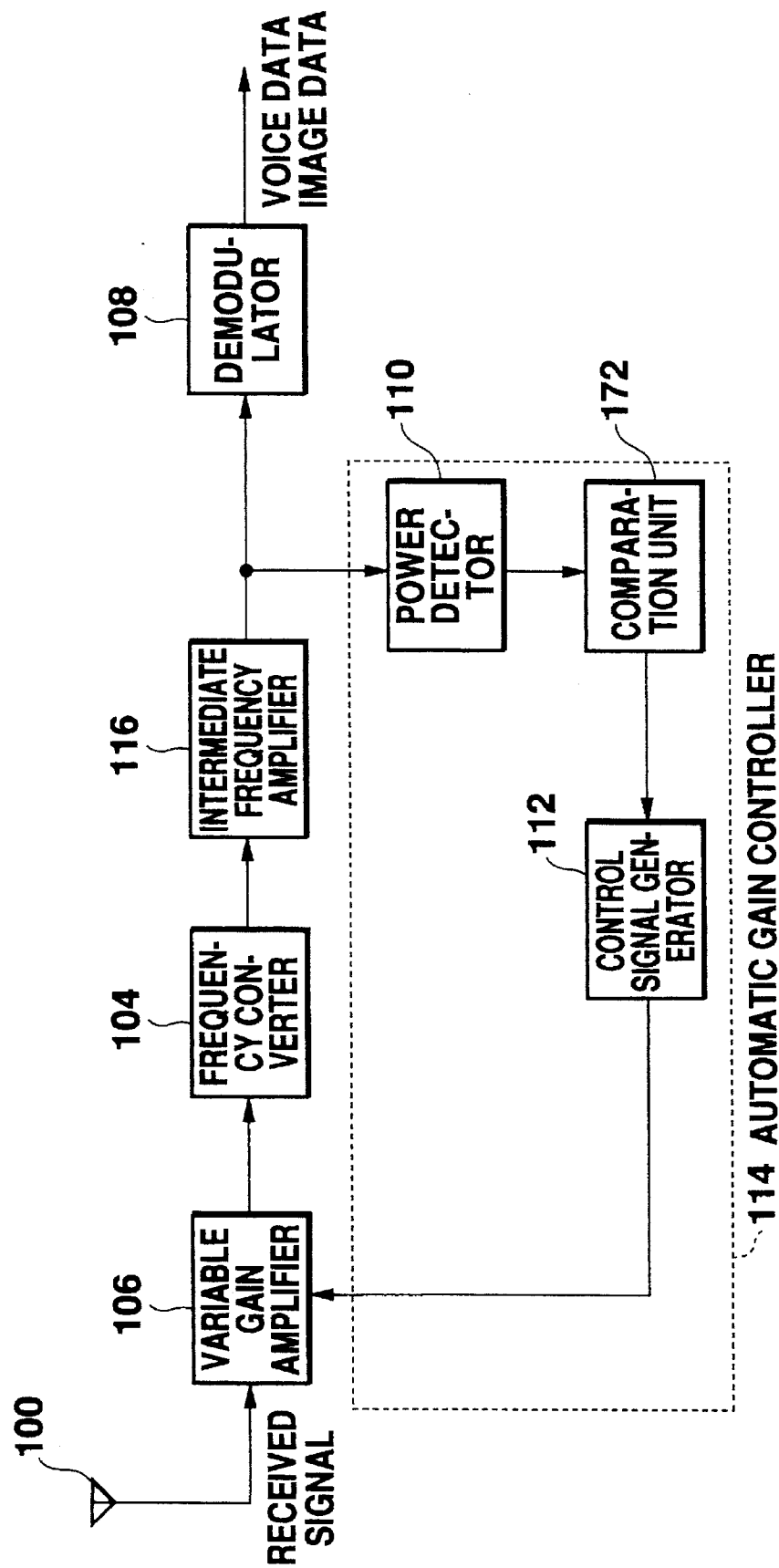
FIG. 2 is a block diagram of the structure of a second embodiment of a receiver according to the present invention.

FIG. 2 shows the structure of a second embodiment of a receiver according to the present invention. In the first embodiment, the gain of the intermediate frequency amplifier is variable. In contrast, in the second embodiment, the gain of the radio frequency amplifier is variable. The modulated wave received by the antenna 100 is amplified by the variable gain amplifier 106 and converted into an intermediate frequency wave by the frequency converter 104. The intermediate frequency is amplified by the intermediate frequency amplifier 116 and the modulated wave is then supplied to the demodulator 108. The power detector 110 detects the instantaneous reception power of the received signal from the received signal output from the intermediate frequency amplifier 116. The comparator unit 172 compares the detected power with a predetermined threshold or a set of predetermined thresholds. The control signal generator 112 controls the gain of the variable gain amplifier 106 on the basis of the result of the comparator.

a.3) Third Embodiment

Figure 3:
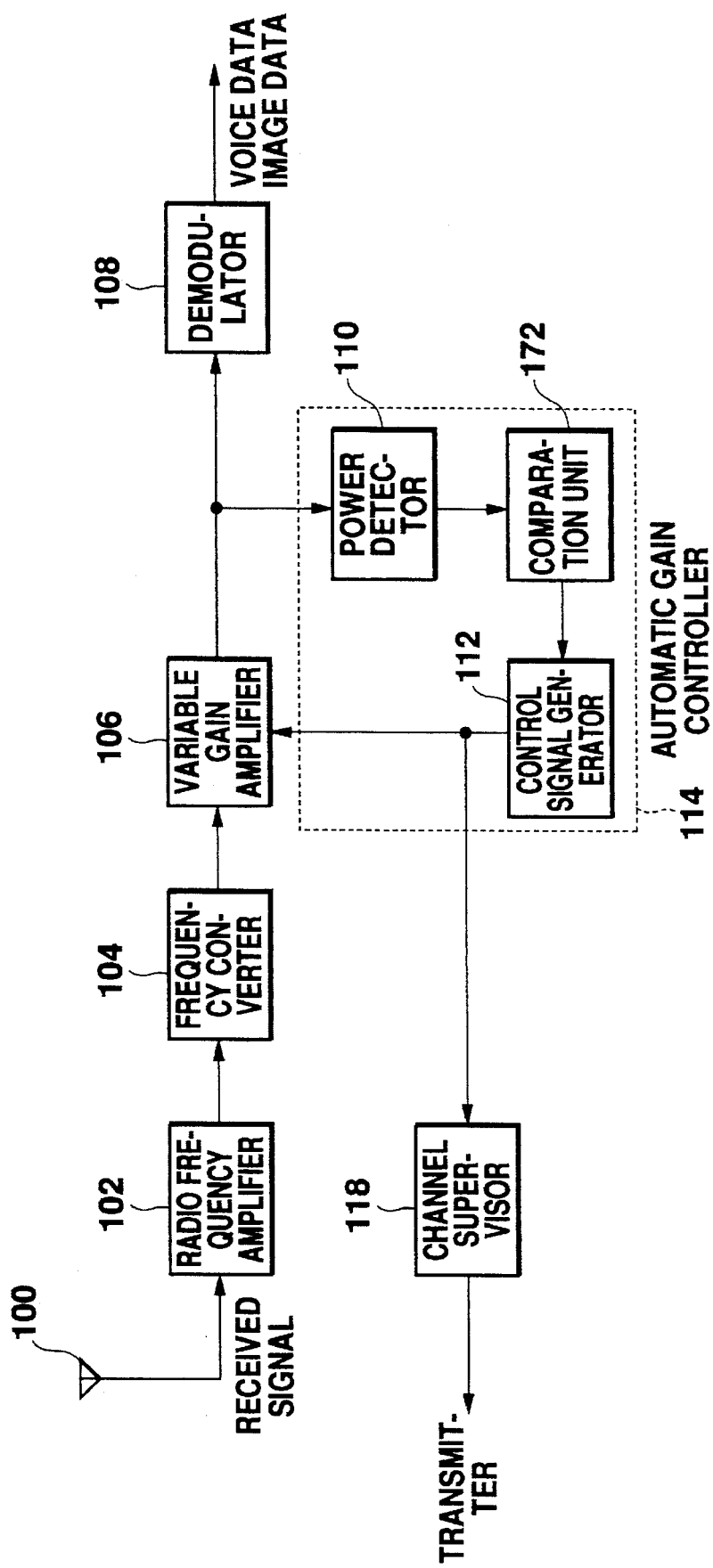
FIG. 3 is a block diagram of the structure of a third embodiment of a receiver according to the present invention.

FIG. 3 shows the structure of a third embodiment of a receiver according to the present invention. In this embodiment, a channel supervisor 118 is added to the structure of the first embodiment. The channel supervisor 118 compares the control signal generated by the control signal generator 112 with a predetermined threshold and transmits the result to a transmitter (not shown) as a transmission power designating signal. The transmitter changes the transmission power for transmitting the modulated wave on a radio wave in accordance with the transmission power designating signal.

a.4) Fourth Embodiment

Figure 4:
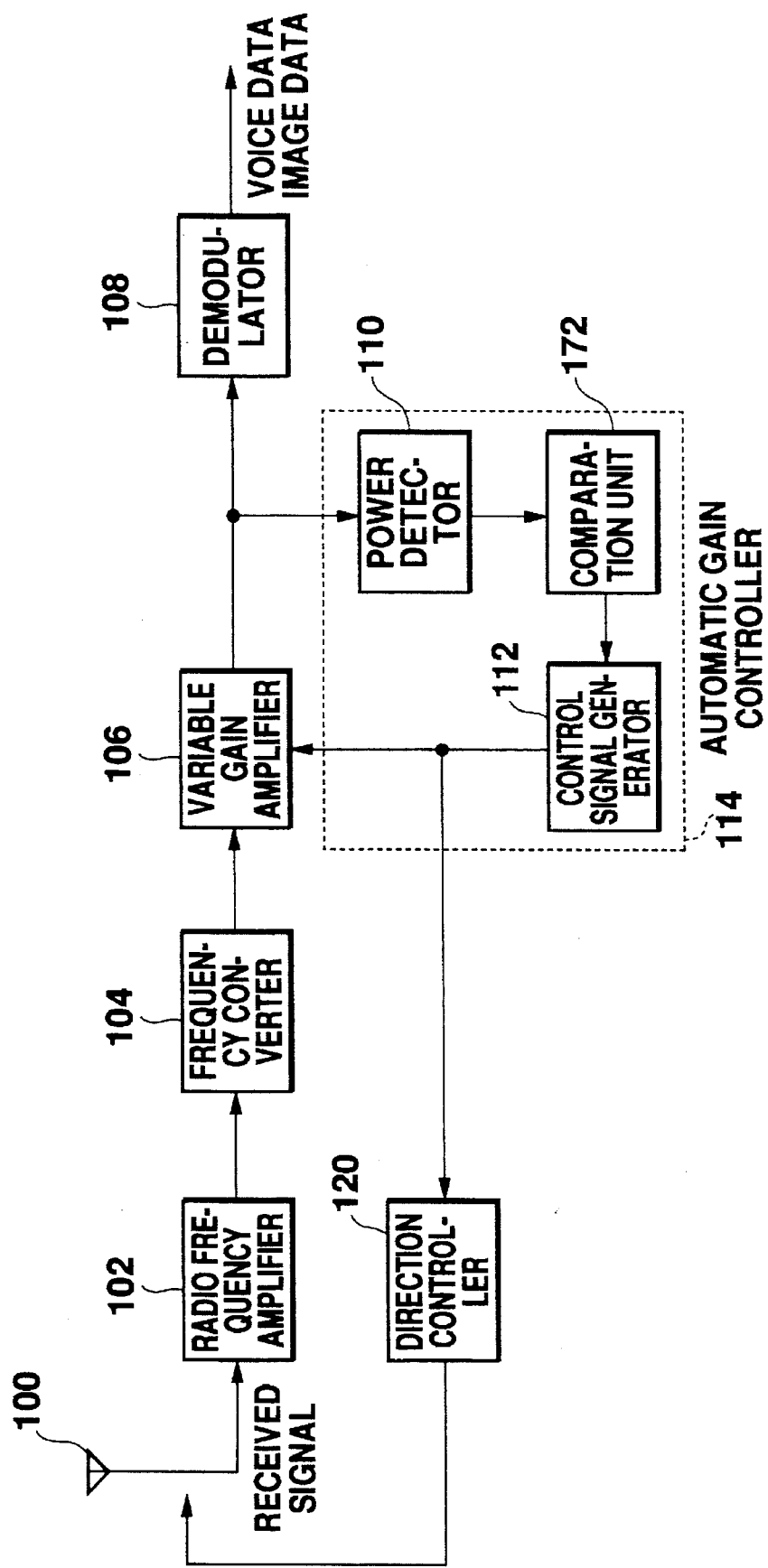
FIG. 4 is a block diagram of the structure of a fourth embodiment of a receiver according to the present invention.

FIG. 4 shows the structure of a fourth embodiment of a receiver according to the present invention. In this embodiment, a direction controller 120 is added to the structure of the first embodiment. The direction controller 120 controls the direction (e.g., azimuth) of the antenna 100 in accordance with the control signal generated by the control signal generator 112.

a.5) Fifth Embodiment

Figure 5:
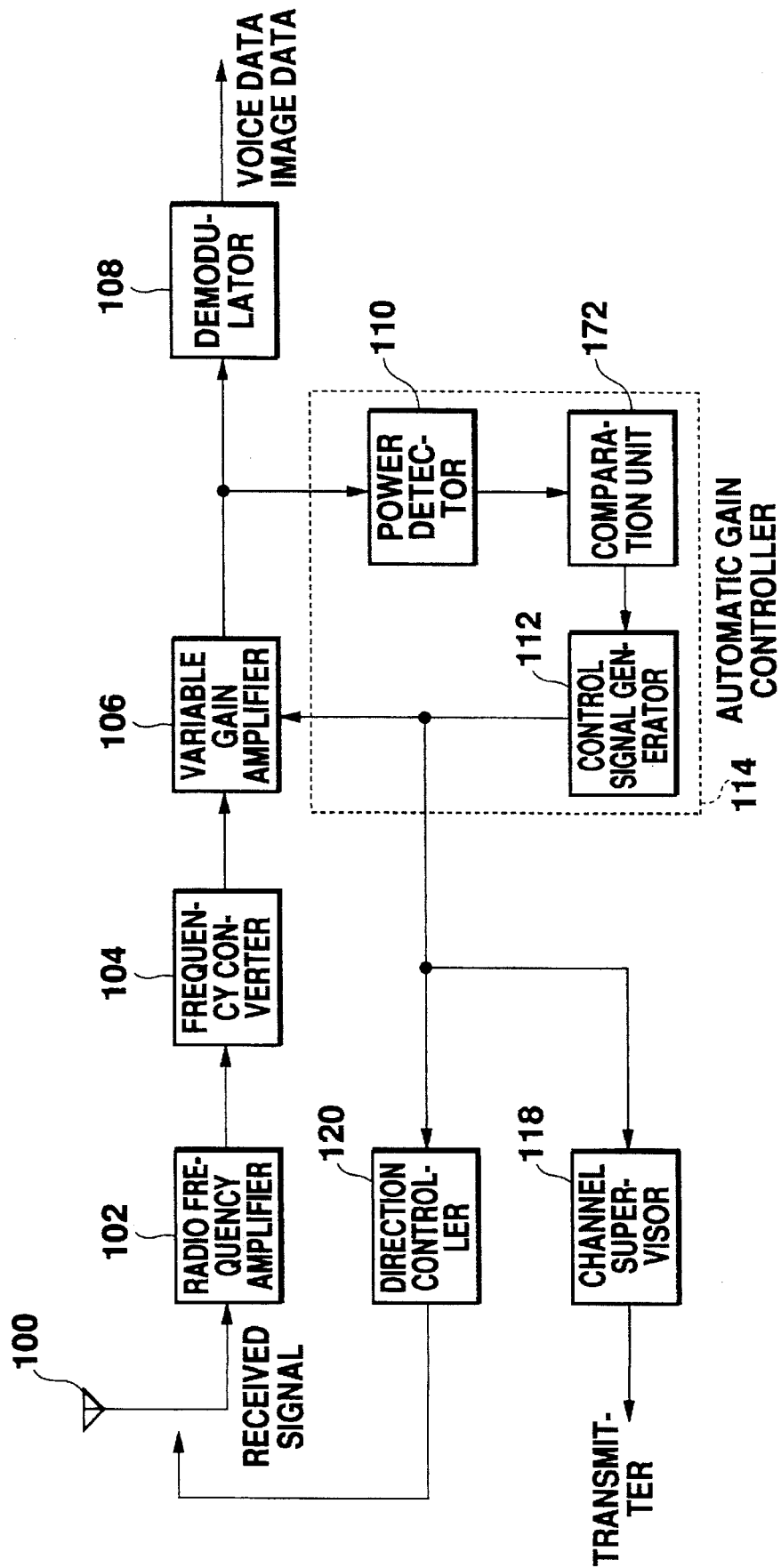
FIG. 5 is a block diagram of the structure of a fifth embodiment of a receiver according to the present invention.

FIG. 5 shows the structure of a fifth embodiment of a receiver according to the present invention. In this embodiment, the channel supervisor 118 and the direction controller 120 are added to the structure of the first embodiment.

a.6) Sixth Embodiment

Figure 6:
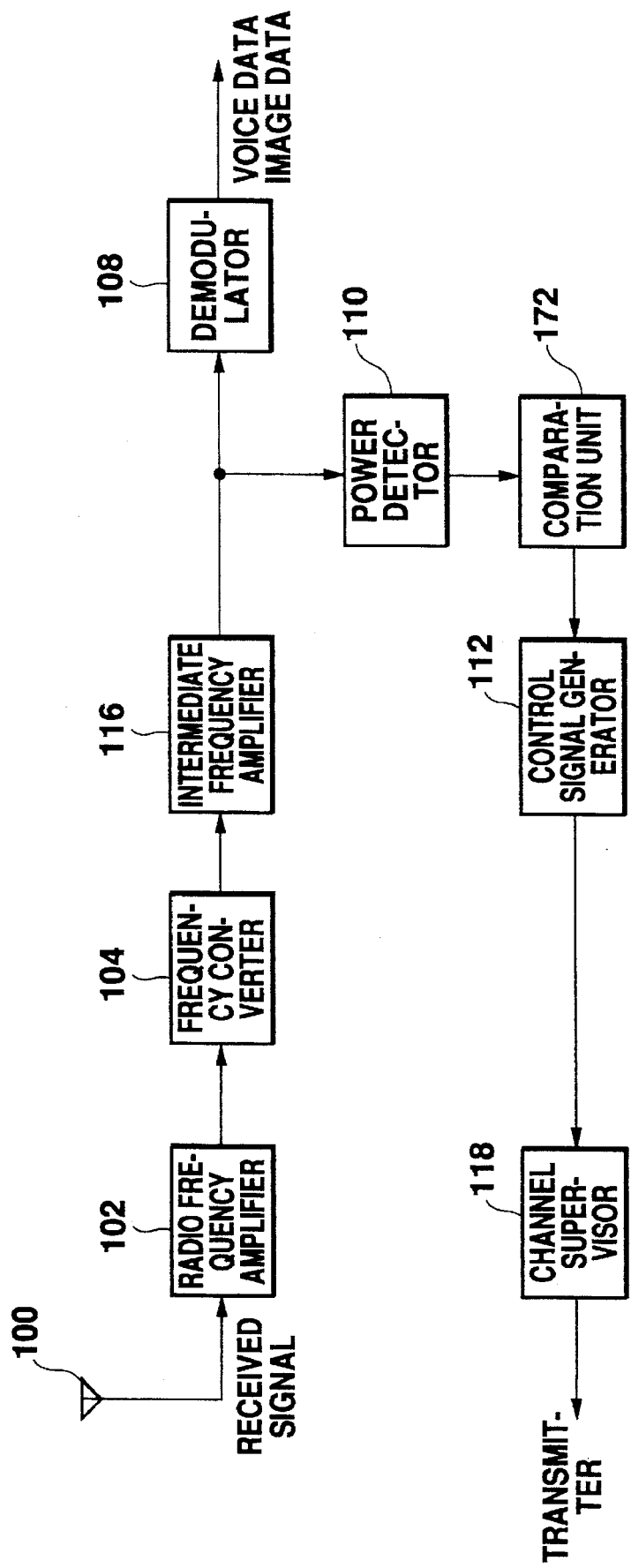
FIG. 6 is a block diagram of the structure of a sixth embodiment of a receiver according to the present invention.

FIG. 6 shows the structure of a sixth embodiment of a receiver according to the present invention. In this embodiment, an intermediate frequency amplifier 116 is provided in place of the variable gain amplifier 106 in the third embodiment and the control signal generated by the control signal generator 112 is used only by the channel supervisor 118. Thus, in this embodiment, the reception power is indirectly controlled in accordance with the transmission power designating signal output from the channel supervisor 118.

a.7) Seventh Embodiment

Figure 7:
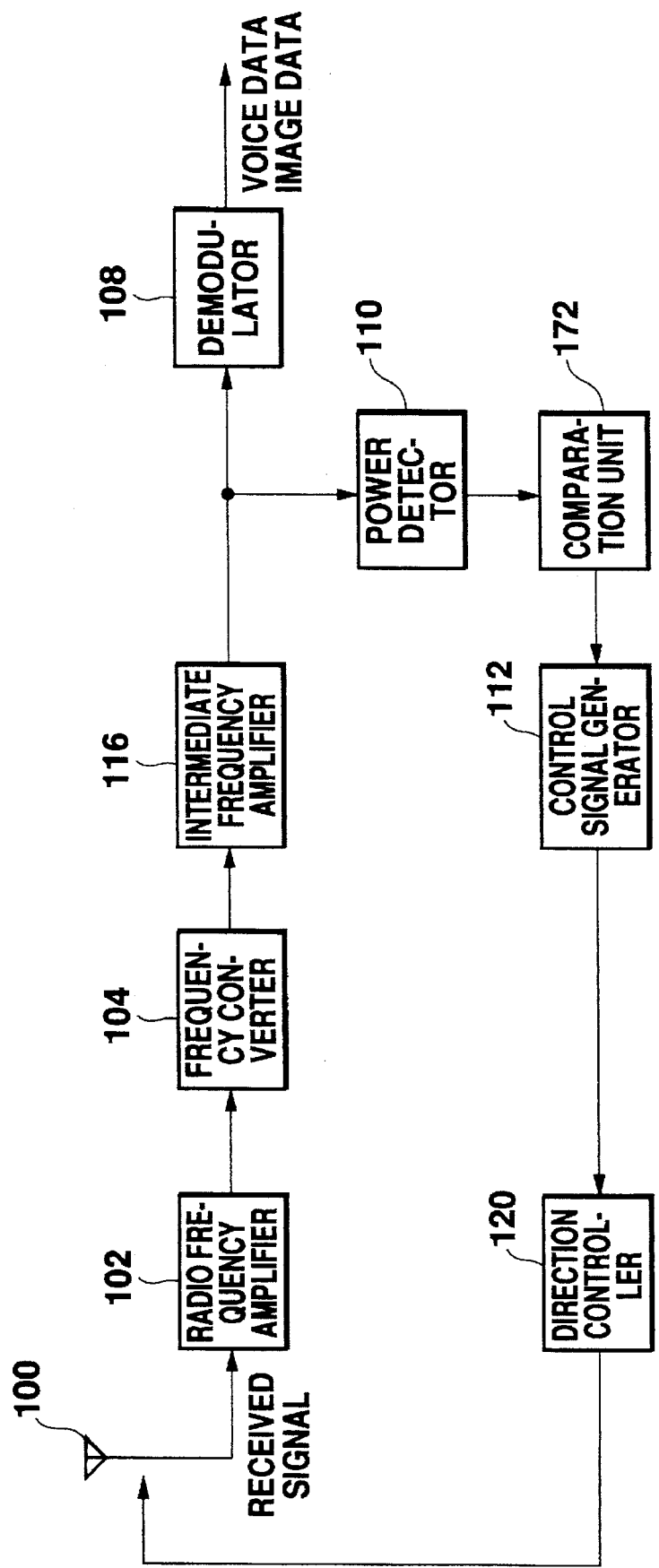
FIG. 7 is a block diagram of the structure of a seventh embodiment of a receiver according to the present invention.

FIG. 7 shows the structure of a seventh embodiment of a receiver according to the present invention. In this embodiment, an intermediate frequency amplifier 116 is provided in place of the variable gain amplifier 116 in the fourth embodiment and the control signal generated by the control signal generator 112 is used only by the direction controller 120. Thus, in this embodiment, the reception power and its quality are indirectly or directly controlled by the direction controller 120.

a.8) Eight Embodiment

Figure 8:
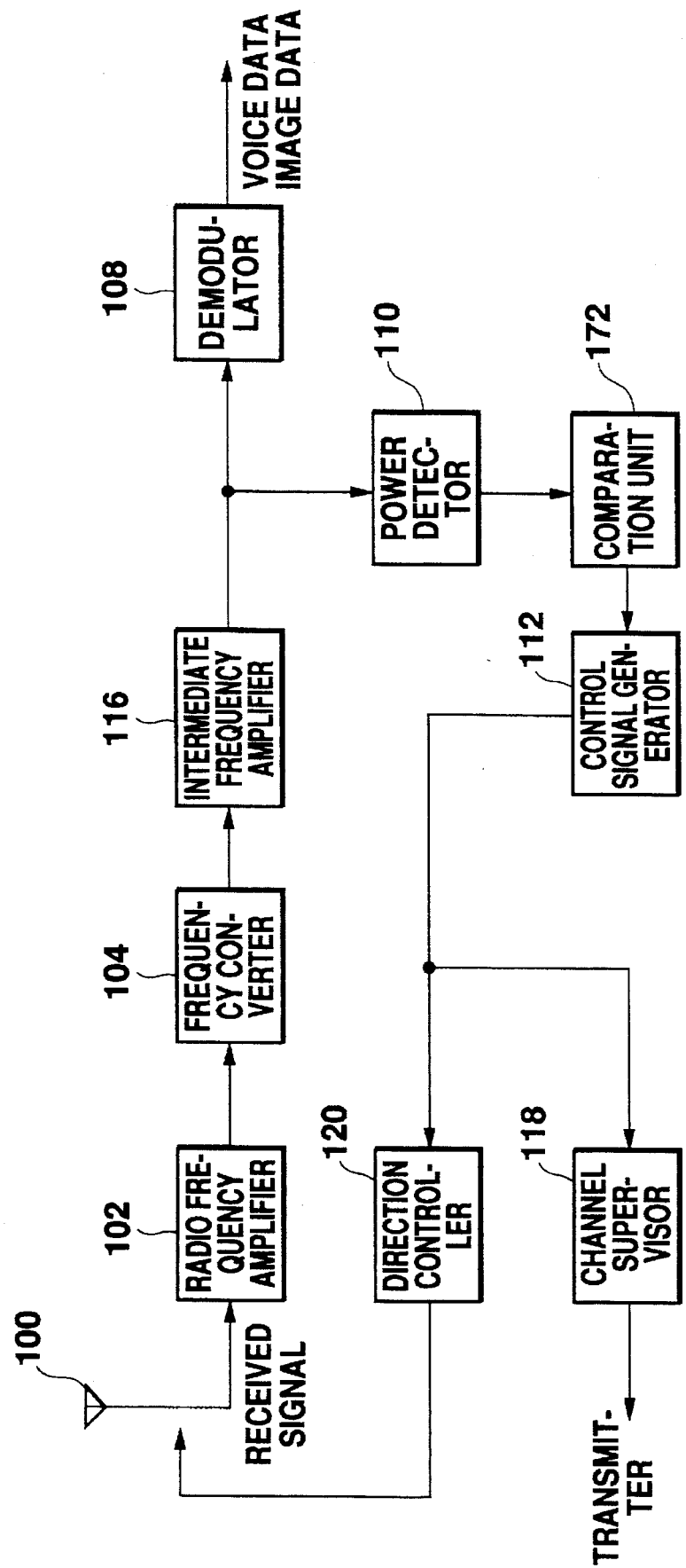
FIG. 8 is a block diagram of the structure of an eighth embodiment of a receiver according to the present invention.

FIG. 8 shows the structure of an eighth embodiment of a receiver according to the present invention. In this embodiment, the sixth and seventh embodiments are combined.

b) Elements of Each Embodiment b.1) Power Detector

Figure 9:
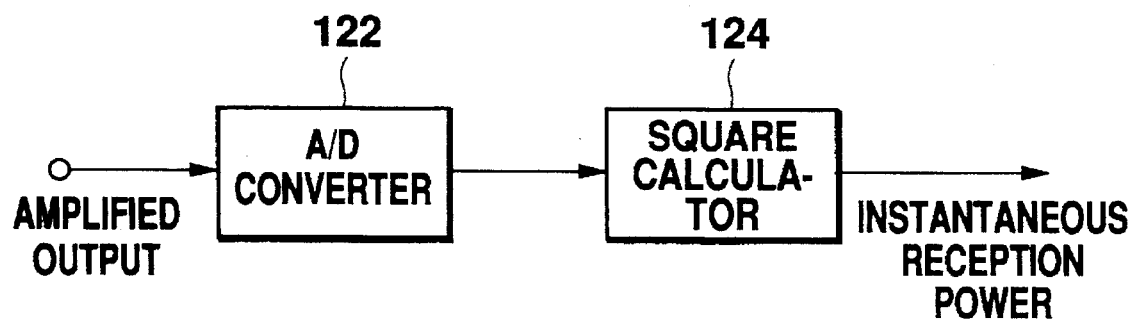
FIG. 9 is a block diagram of an example of the structure of a power detector.

FIG. 9 shows an example of the structure of the power detector 110. The power detector 110 is composed of an A/D converter 122 and a square calculator 124. The received signal amplified by the variable gain amplifier 106 or the intermediate frequency amplifier 116 is sampled by the A/D converter 122 and converted into a digital signal. The converted digital signal is squared by the square calculator 124. If it is assumed that the value of the digital received signal at the time i is $r_i$, the square calculator 124 is calculated as $$p_i = r_i$$

The square calculator 124 supplies the $p_i$ obtained, i.e., the instantaneous reception power at the time i to the comparation unit 172. The positions of the A/D converter 122 and the square calculator 124 may be exchanged for each other.

b.2) Comparator Unit and Control

Figure 10:
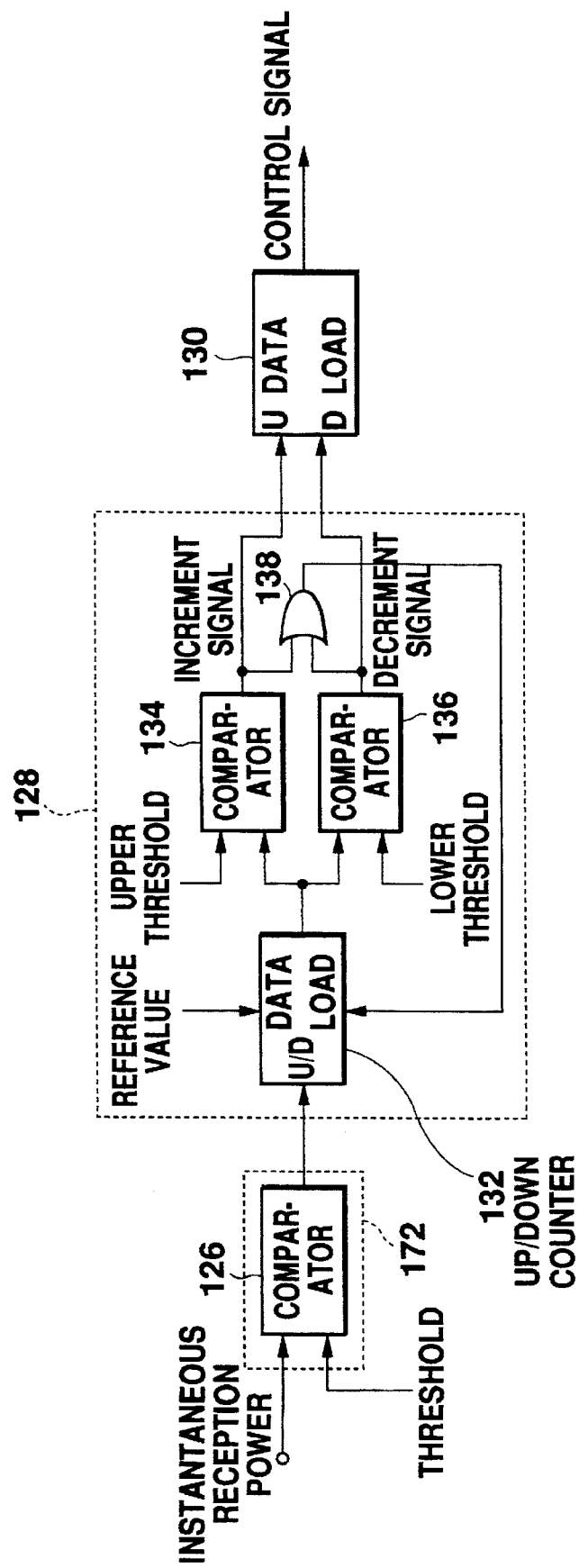
FIG. 10 is a block diagram of an example of the structure of a control signal generator.

FIG. 10 shows an example of the structure of the comparator unit 172 and control signal generator 112. The comparator unit 172 is composed of a comparator 126 and the control signal generator 112 is composed of a random walk filter 128 and an up-down counter 130. The instantaneous reception power $p_i$ detected by the power detector 110 is compared with a predetermined threshold th by the comparator 126. The comparator 126 outputs 1 when $p_i \geq th$ and 0 when $p_i < th$ as a count direction signal $C_i$. The random walk filter 128 is composed of an up-down counter 132, comparators 134, 136 and a logical OR 138. In the up-down counter 132, a predetermined reference value is set in advance via a DATA terminal. The counting period of the up-down counter 132 is the same as the sampling period T of the A/D converter 122. The up-down counter 132 increases the count value $N_i$ by 1 when the count direction signal $C_i$ supplied to the U/D terminal is 1 and reduces it by 1 when the count direction signal $C_i$ is 0. The comparators 134, 136 compare the count value $N_i$ of the up-down counter 132 with the upper threshold $th_u$ and the lower threshold $th_l$, respectively. The comparators 134, 136 output an increment signal and an decrement signal when $N_i > th_u$ and when $N_i < th_l$, respectively. When the increment signal or the decrement signal is output, the logical OR 138 supplies a load signal to the LOAD terminal of the up-down counter 132. The up-down counter 132 is then loaded with the reference value between the upper threshold th and the lower threshold $th_l$.

The increment signal and the decrement signals are input to the U terminal and the D terminal, respectively, of the up-down counter 130. The counting period of the up-down counter 130 is the same as the sampling period T of the A/D converter 122. The up-down counter 130 increases the count value $M_i$ by 1 in accordance with the increment signal and reduces it by 1 in accordance with the decrement signal.

Figure 11:
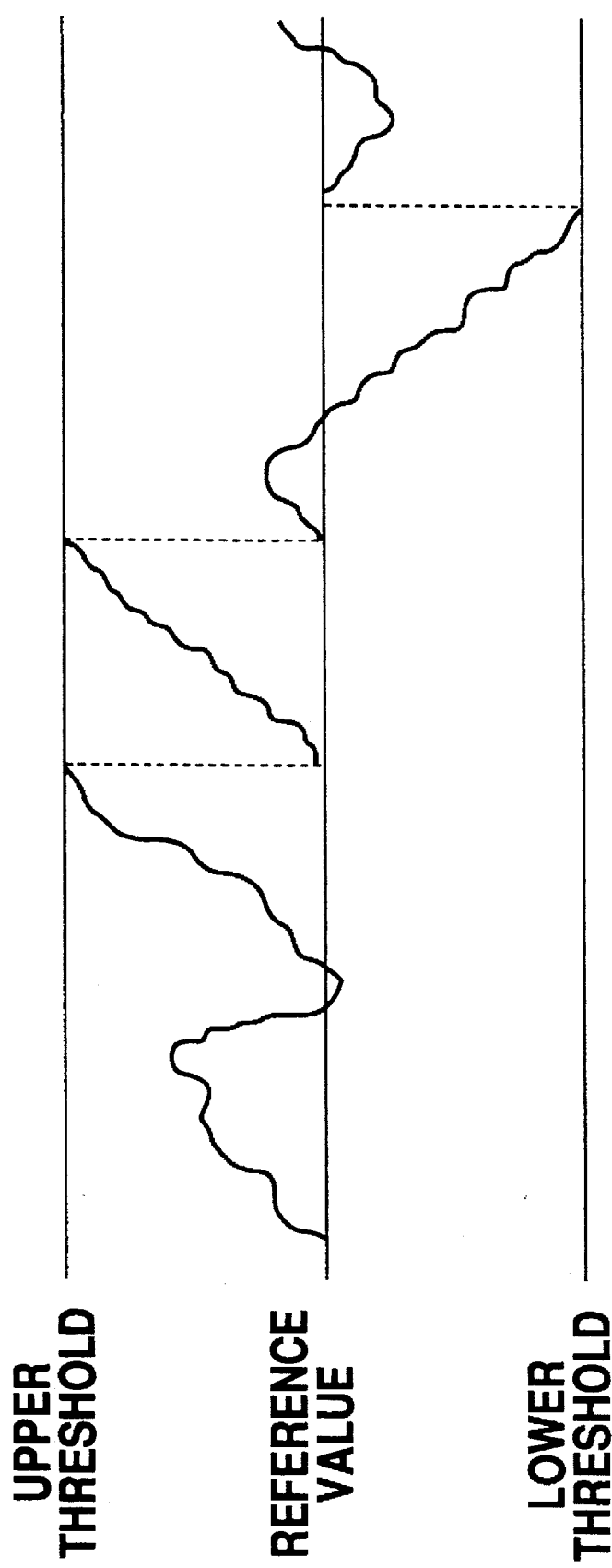
FIG. 11 shows the smoothing operation of a random walk filter.

The thus-obtained count value $M_i$ of the up-down counter 130 is the same as the value obtained by averaging the variations in the instantaneous reception power $p_i$ in a predetermined past period. Since the count direction signal $C_i$ output from the comparator 126 is a signal obtained by quantizing the instantaneous reception power $p_i$ in 1 bit, the amount $N_i$ which corresponds to the time-integrated instantaneous reception power $p_i$ is obtained by counting the instantaneous reception power $p_i$ by the up-down counter 132. The counted value $N_i$ is constantly maintained between the upper threshold $th_u$ and the lower threshold $th_l$ in accordance with the load signal output from the logical OR 138, as shown in FIG. 11. In other words, since the variation in the count value $N_i$ is limited by the upper threshold $th_u$ and the lower threshold $th_l$, the count value $N_i$ becomes a smoothed count value, i.e., an averaged variation. Since the increment signal and the decrement signal output from the comparators 134 and 136, respectively, are the values obtained by quantizing the smoothed count value $N_i$ in 2 bits, the count value $M_i$ of the up-down counter 130 for counting in accordance with these signals indicates whether the average variation of the reception power deviates from the desired value toward a smaller value or a larger value and the degree of deviation.

It is therefore possible to control the power of the received signal output from the variable gain amplifier 106 to be constant by controlling the gain of the variable gain amplifier 106 by using the count value $M_i$ as the control signal. In the third to eighth embodiments, it is possible to control the transmission power or the antenna azimuth by using the count value $M_i$ in the channel supervisor 118 or the direction controller 120 to improve the quality of the received signal and to avoid the variance of the reception power.

A first reason why the receiver of the present invention dispenses with a conventional digital filter is that the random walk filter 128 is used. The random walk filter 128 has a function of counting, smoothing and quantizing an input signal (i.e., the count direction signal $C_i$), as is clear from FIG. 11, and the cut-off frequency of the random walk filter 128 is determined by the upper threshold $th_u$ and the lower threshold $th_l$. In other words, if the difference between the upper threshold $th_u$ and the lower threshold $th_l$ is increased, the cut-off frequency becomes low, and if the difference is reduced, the cut-off frequency becomes high.

If the cut-off frequency is low, it is possible to cut off a fluctuation in time domain of a comparatively high frequency wave of the count direction signal $C_i$, so that oscillation of the feedback loops respectively for the AGC, the transmission power control and for the antenna azimuth control is unlikely to be caused in the AGC 114. Consequently, each embodiment of the present invention is applicable not only to a modulation system such as an MSK in which the envelope level of the modulated wave is constant but also to a modulation system such as a QPSK in which the envelope level of the modulated wave is not constant. On the other hand, if the cut-off frequency is high, the responsiveness of the feedback loops is improved. In other words, in the structure shown in FIG. 10, the same advantages are obtained as those in the conventional digital filter having the same tap number by setting the upper threshold $th_u$ and the lower threshold $th_l$.

Even if the difference between the upper threshold $th_u$ and the lower threshold $th_l$ is increased in order to process the received signal in a wider dynamic range, problems such as an increase in the circuit scale are not produced, unlike the case of increasing the tap number. That is, a digital filter which requires a huge circuit and stupendous processing is dispensed with in each embodiment of the present invention. As a result, the circuit scale, the power consumption, and the processing load are reduced.

b.3) Modification of the Power Detector

Figures 12, 13:
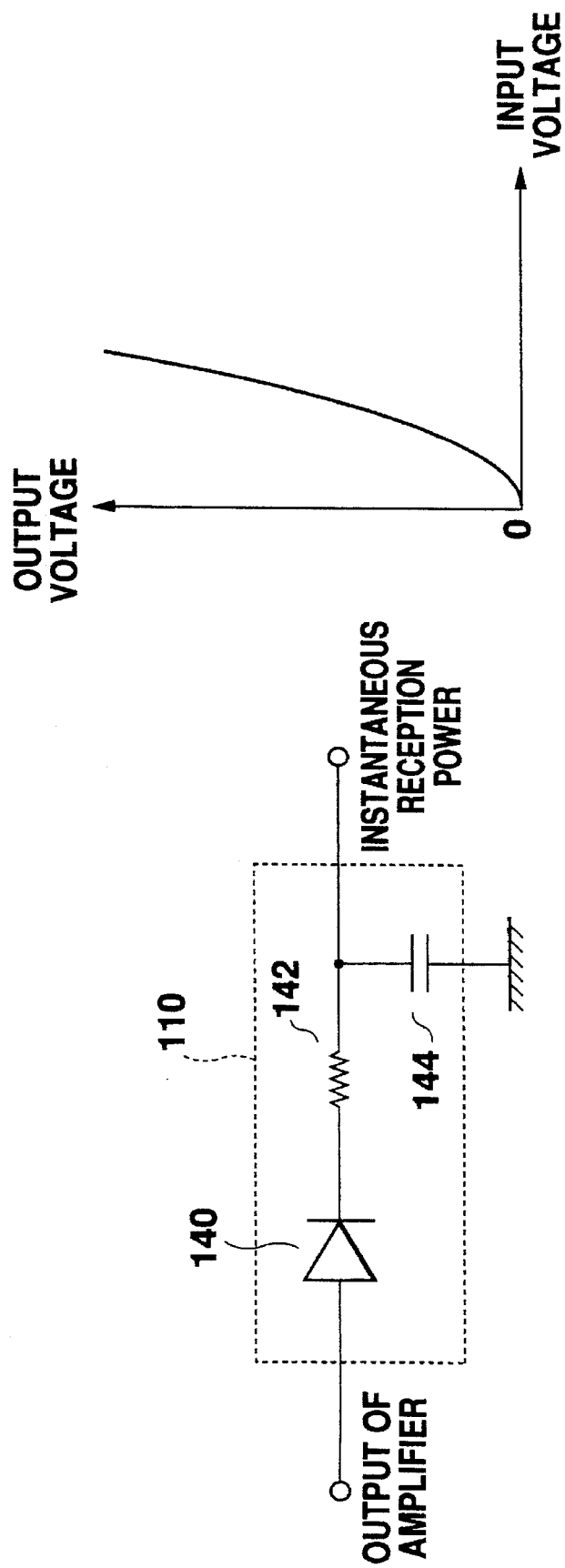
FIG. 12 is a circuit diagram showing another example of the structure of the power detector.
FIG. 13 shows the characteristic of a diode.

An analog circuit such as that shown in FIG. 12 is usable as the power detector 110 in place of the digital circuit such as that shown in FIG. 9. In the analog circuit, the amplified received signal is detected by a diode 140 having the square characteristics shown in FIG. 13, and integrated by a resistor 142 and a capacitor 144. This structure produces similar advantages to those of the power detector 110 using the digital circuit. In the case of adopting the analog circuit, it is necessary to use an analog comparator as the comparator 126.

b.4) Modification of Comparator Unit and Control Signal Generator

Figure 14:
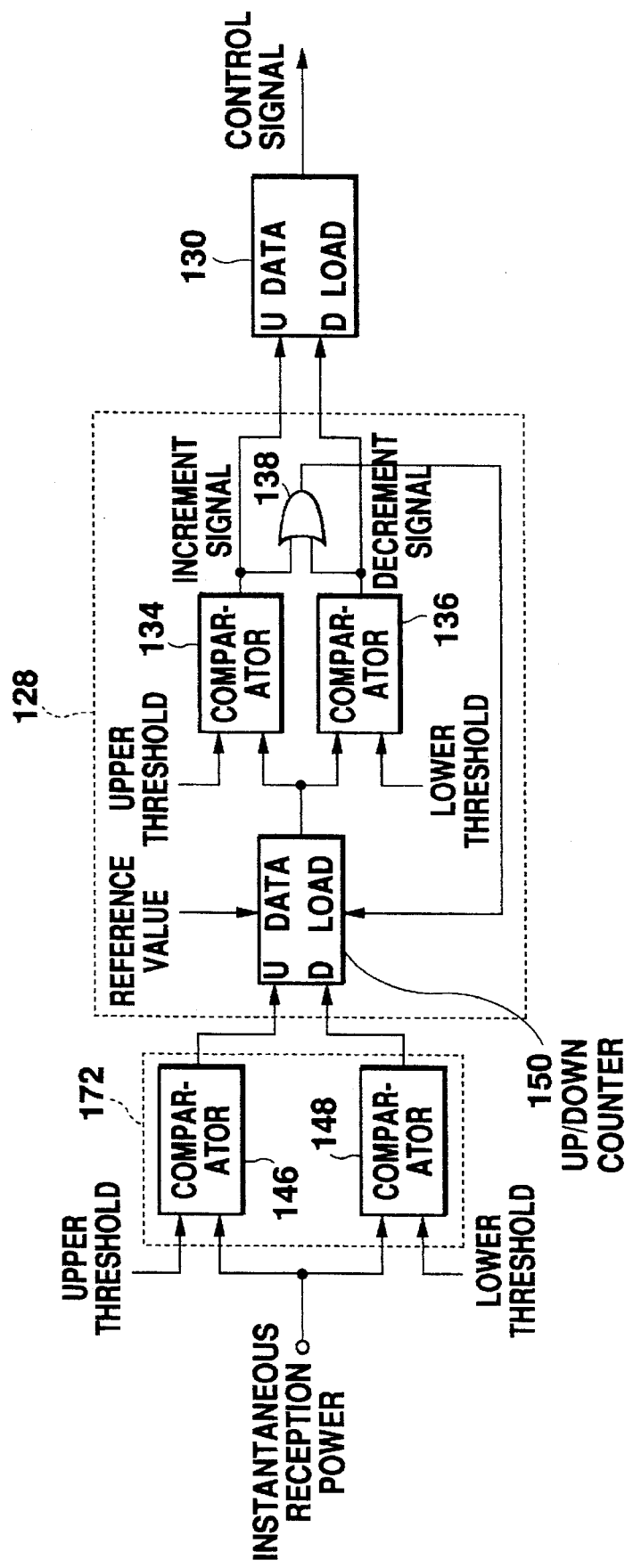
FIG. 14 is a circuit diagram showing another example of the structure of the control signal generator.

The comparator unit 172 and control signal generator 112 may have a structure such as that shown in FIG. 14. In FIG. 14, comparators 146, 148 are used in place of the comparator 126, and an up-down counter 150 having a U terminal and a D terminal is used in place of the up-down counter 132 having the U/D terminal.

The instantaneous reception power $p_i$ detected by the power detector 110 is compared with an upper threshold $pth_u$ and a lower threshold $pth_l$ by the comparators 146 and 148, respectively. The comparators 146 and 148 output an increment signal and a decrement signal when $p_i > pth_u$ and when $p_i < pth_l$, respectively. The up-down counter 150 increases the count value $N_i$ by 1 in accordance with the increment signal which is supplied from the comparator 146 via the U terminal and reduces it by 1 in accordance with the decrement signal which is supplied from the comparator 148 via the D terminal upper threshold $pth_u$ and the lower threshold $pth_l$, it is possible to In this manner, by generating the count direction signal $C_i$ to be supplied to the random walk filter 128 by using the different provide a dead zone in which the up-down counter 150 at the input portion of the random walk filter 128 does not count. In this case, even if the instantaneous reception power $p_i$ fluctuates with the fluctuation of the envelope level, as happens when a QPSK modulated wave is received, it is possible to appropriately prevent a fluctuation or oscillation of a control signal due to the fluctuation of the instantaneous reception power $p_i$. For example, when the width of the fluctuation of the instantaneous reception power $p_i$ with the fluctuation of the envelope level is $\pm V$, a dead zone having a width of $\pm T$ (T>V) is provided, as shown in FIG. 15.

Figure 15:
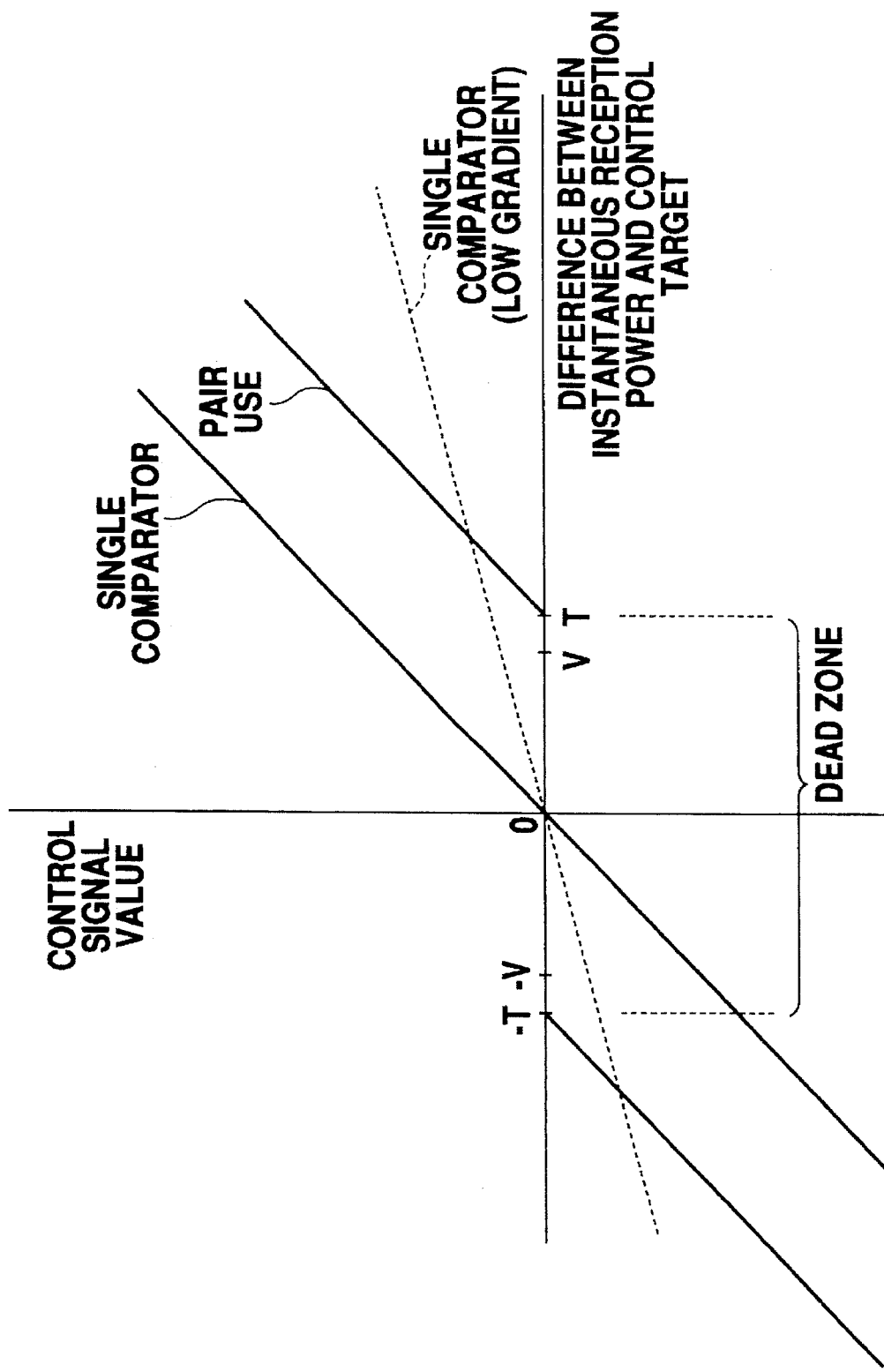
FIG. 15 explains a dead zone.

Another method for preventing a fluctuation or oscillation of a control signal due to the fluctuation of the envelope level of the instantaneous reception power $p_i$, is a method of reducing the gradient of the control signal relative to an error in the control, as indicated by the broken line in FIG. 15. According to this method, the control signal has a comparatively small value, and it is possible to suppress a fluctuation or oscillation of the control signal when the error in the control is in the range of $0 \pm V$. However, the control signal also has a small value even if the error in the control goes out of the range of $0 \pm V$, there is a problem of a reduction in the response speed. Therefore, a method of providing a dead zone is preferable in that there is no problem of a reduction in the response speed.

The number of comparators for supplying the count direction signal to the random walk filter 128 is not restricted to two. In the case of applying the present invention to a modulation system for carrying information using or an amplitude such as a QAM (Quadrature Amplitude Modulation), a multiplicity of, for example, four or eight comparators are preferably provided.

Figure 16:
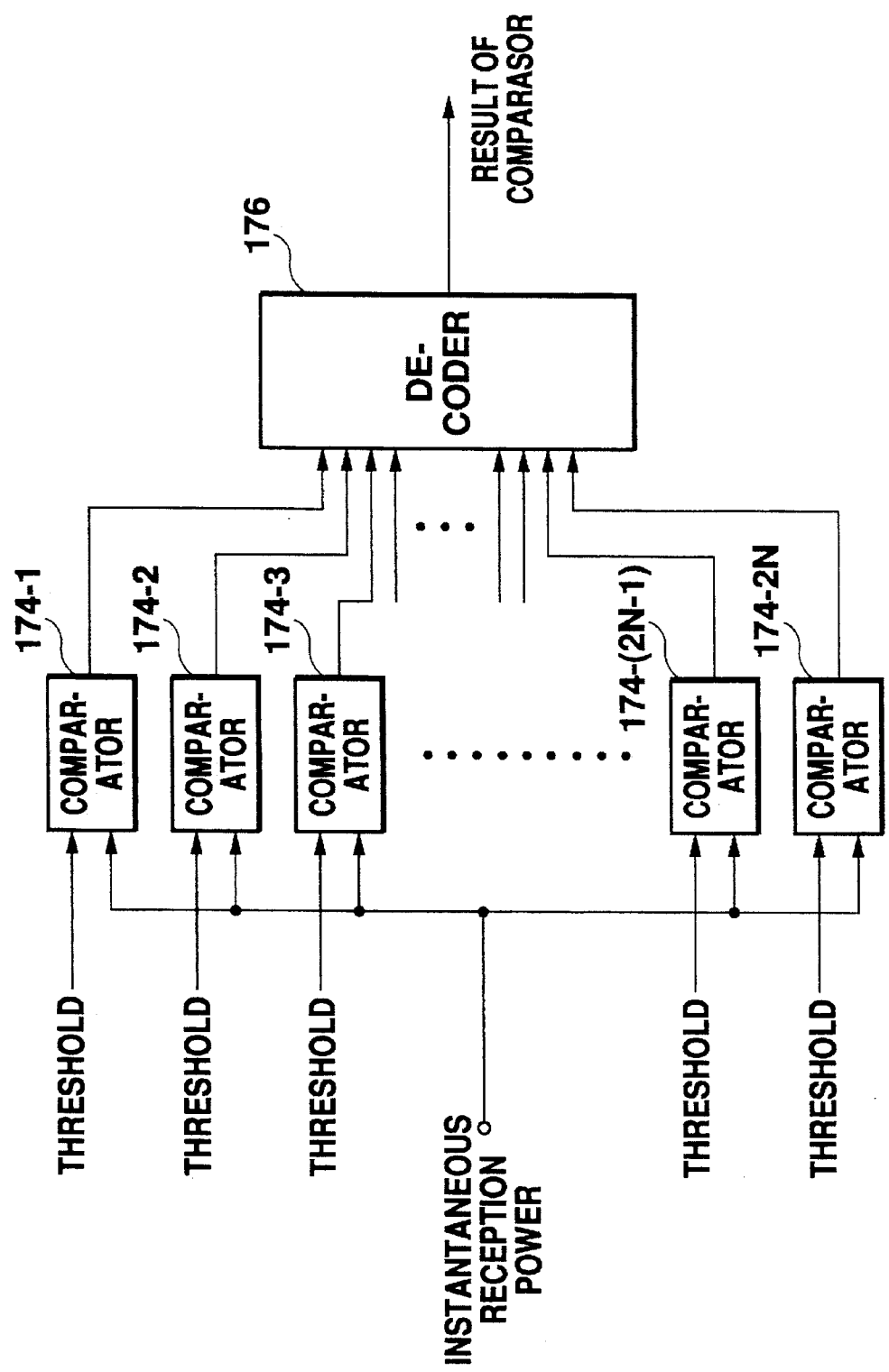
FIG. 16 is a block diagram of another example of the structure of the comparation unit.

FIG. 16 shows the structure of the comparator unit 172 having 2N comparators 174-1, 174-2, . . . 174-2N and a decoder 176 (N: natural number). The comparators 174-1, 174-2, . . . 174-2N compare the instantaneous reception power $p_i$ with corresponding thresholds $th_1, th_2, \ldots th_{2N}$.

respectively. The thresholds $th_1, th_2, \ldots th_{2N}$ are set so that the condition $th_1 > th_2 < \ldots < th_{2N}$ is satisfied. For example, in the case of N=4 and the target level =100, the thresholds are set as $th_1=25(-6\text{ dB})$, $th_2=50(-3\text{ dB})$, $th_3=200(\pm 3\text{ dB})$ and $th_4=400(\pm 6\text{ dB})$. The comparators 174-1, 174-2, . . . 174-2N outputs a signal whose value is "1" when $p_i \geq th_i$ and "0" when $p_i < th_i$. The decoder 176 counts the number n of signal having "1" value, subtracts N from the count value and output the subtraction result n−N to the random walk filter 128 as the count direction. signal $C_i$. The up-down counter 132 add the count value $N_{i-1}$ and the count value signal $C_i$ and produces the count value $N_i$. As will be apparent from the above description, the dynamic range of the received signal is divided into 2N+1 subranges by the comparators 174-1, 174-2, ... 174-2N and the number n indicates the subrange to which the instantaneous reception power $p_i$ belongs, for example, in the case that the thresholds are set as $th_i = 25(-6\text{ dB})$, $th_2 = 50(-3\text{ dB})$, $th_3 = 200(+3\text{ dB})$ and $th_4 = 400(+6\text{ dB})$ and the target level =100, the number n takes the following value:

n=−2 for $p_i < 25$
n=−1 for $25 \leq p_i < 50$
n=0 for $50 \leq p_i < 200$
n=1 for $200 \leq p_i < 400$
n=2 for $400 \leq p_i$ Namely, by setting the thresholds $th_1, th_2, \ldots th_{2N}$ so that they have a constant interval on the logarithm scale, the pull-in time when starting from the +XdB deviation becomes the same as when starting from the −XdB deviation. This implies shortening the pull-in time when starting from the +XdB deviation and stabilizing the pull-in operation when starting from the −XdB deviation. In addition, by utilizing the structure of FIG. 16, it is not necessary to use a log-converter or a log-amplifier which causes complication of the circuit and increased power consumption, thus the circuit is simplified and the power consumption is reduced.

b.5) Modification of Random Walk Filter

Figure 17:
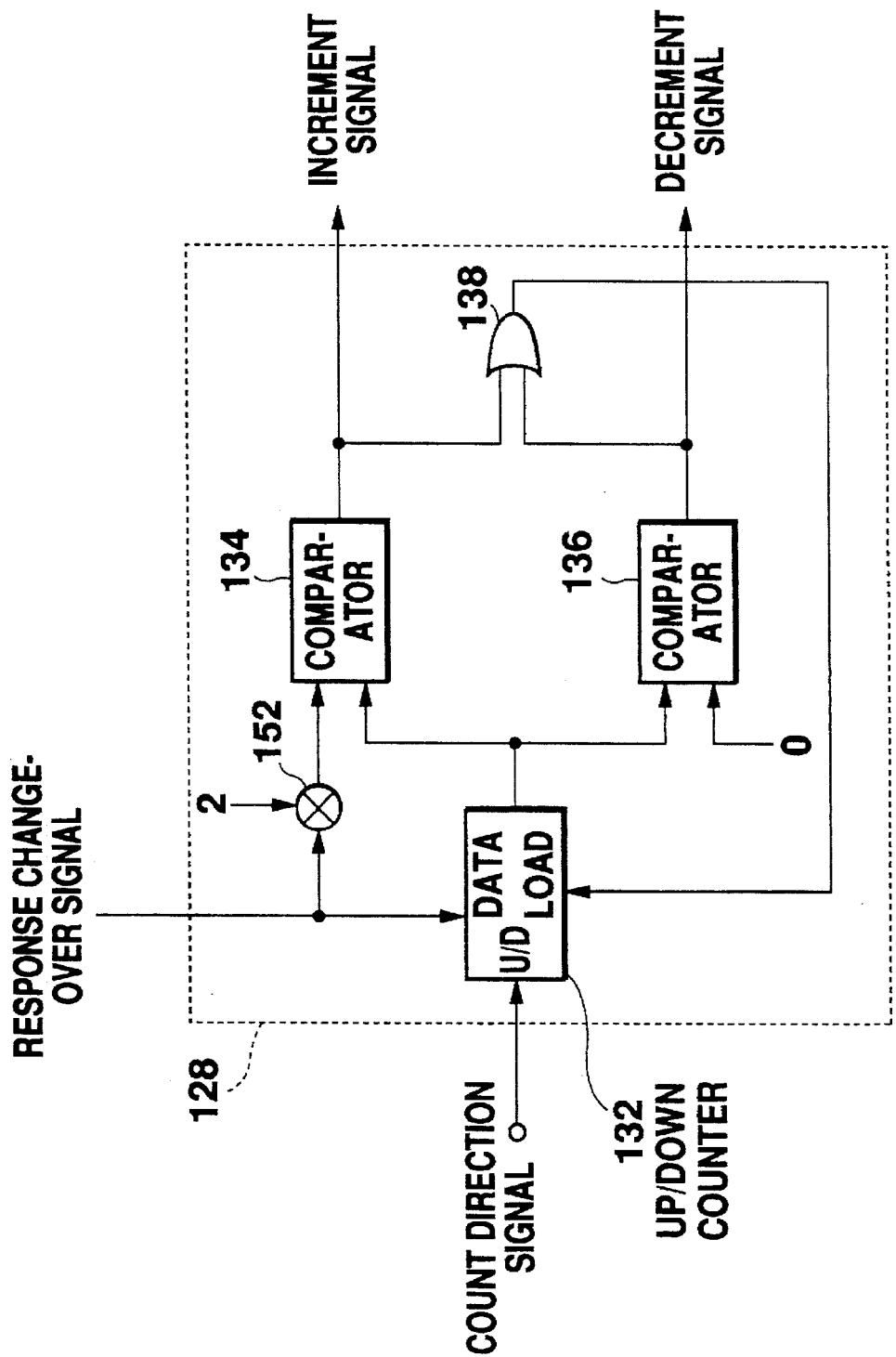
FIG. 17 is a block diagram of another example of the structure of the random walk filter.

FIG. 17 shows an example of a modification of the random walk filter 12. In this modification, a multiplier 152 is added to the structure shown in FIG. 14. In addition, the signal supplied to the DATA terminal of the up-down counter 132 is a response changeover signal. The response changeover signal is multiplied by 2 by the multiplier 152 and then supplied to the comparator 134. 0 is supplied to the comparator 136.

The response changeover signal is produced in correspondence with the operation in the receiver by the user so that the signal, which is ordinarily large, becomes small when high-speed pulling is upper threshold $th_u$ and 0 is set as the lower threshold $th_l$. necessary. As is clear from comparison between FIGS. 14 and 17, double the value of the response changeover signal is set as the Therefore, according to the structure shown in FIG. 12, the cut-off frequency and the response of the random walk filter 128 are automatically switched as occasion demands.

Figure 18:
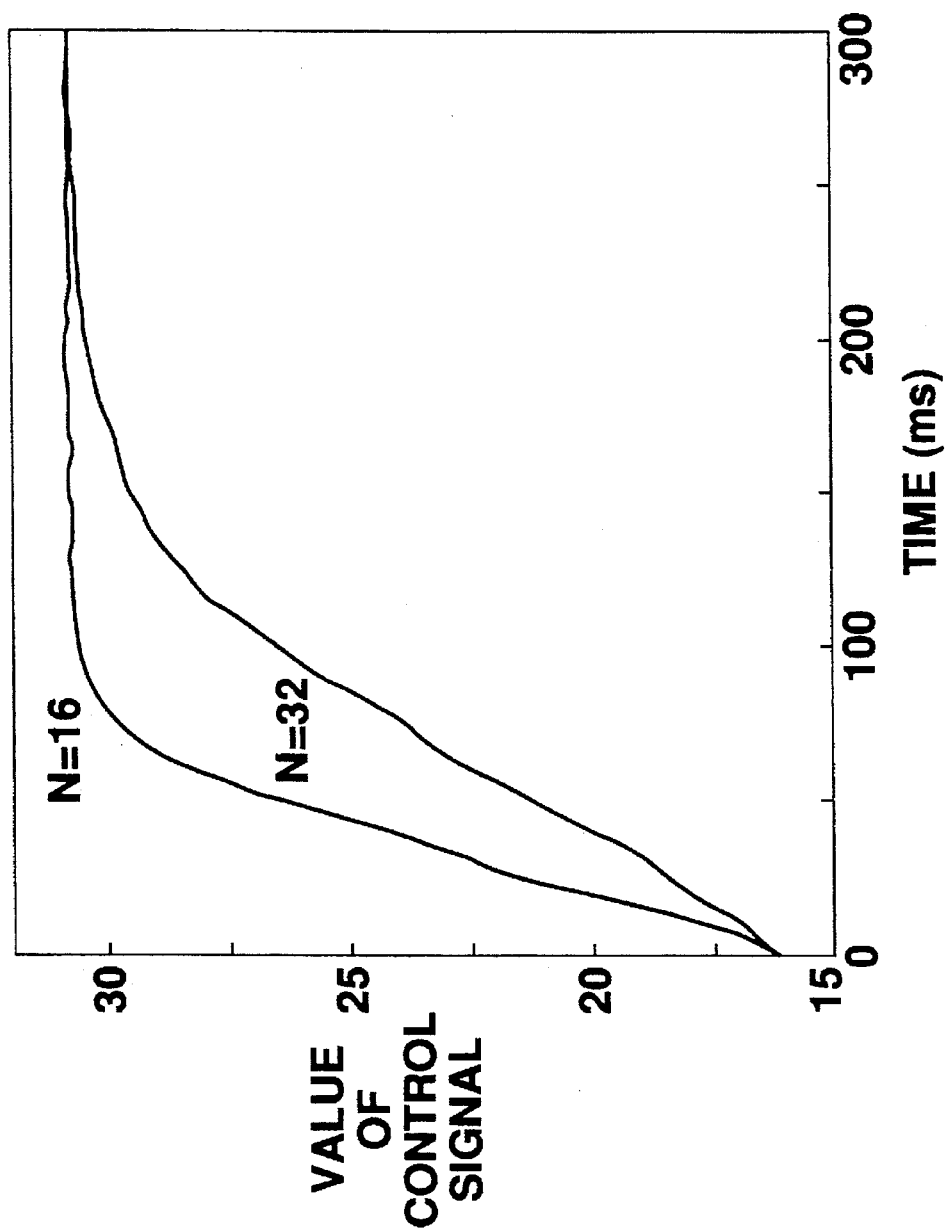
FIG. 18 shows the operation of a tap number switching signal.

As is clear from FIG. 18, the control signal responds much more rapidly when the value N of the response changeover signal is 16 than when it is 32. In FIG. 18, it is assumed that the comparator unit 172 shown in FIG. 10 is used, the dynamic range of the control signal is 5 bits, the control target of the reception power is −30 dBm and the value of the control signal when the reception power is coincident with the control target is 16.

Figure 19:
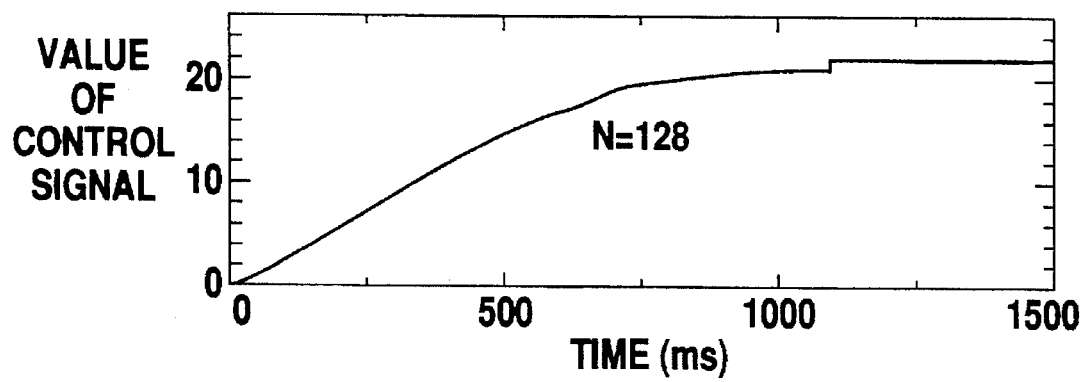
FIG. 19 shows the variation of the control signal when N is large.
Figure 20:
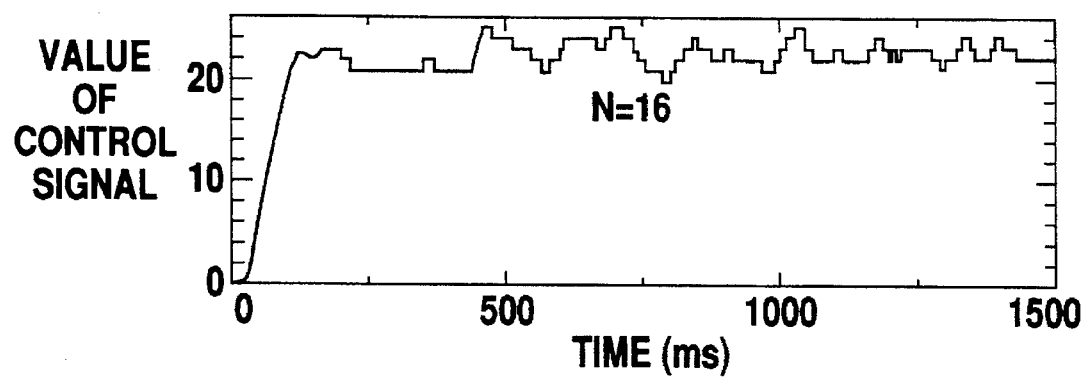
FIG. 20 shows the variation of the control signal when N is small.
Figure 21:
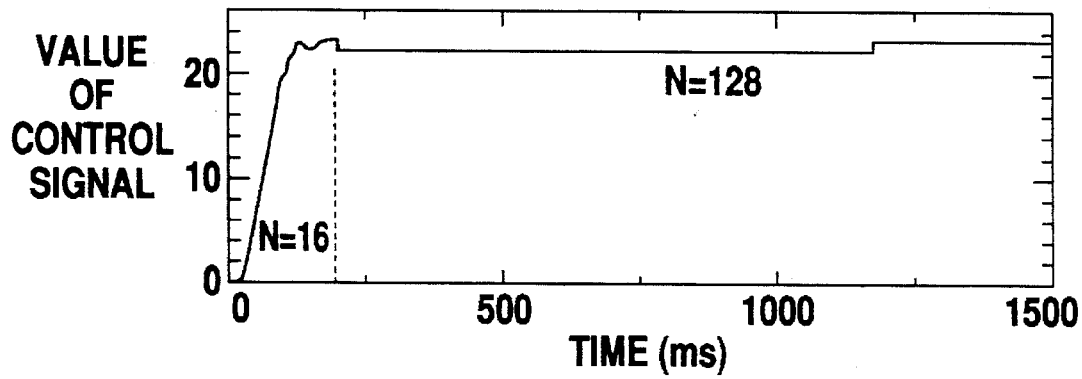
FIG. 21 shows the variation of the control signal when N is changed from a smaller value to a larger value.

Further, by changing the valve N of the response changeover signal in one control period, pull-in time is shortened and the operation is stabilized remarkably. As shown in FIG. 19, the long pull-in time is required when the value N is large, and in FIG. 20, the astable operation occurs when the value N is small. Accordingly, by changing N from a smaller value (for example, 16) to a larger value (for example, 128) at an appropriate time point (for example, 200 ms), both rapid pull-in and stabilization are realized, as shown in FIG. 21.

It is clear to those skilled in the art that the control signal generator shown in FIG. 17 can adopt the structure shown in FIG. 17.

b.6) Modification of Control Signal Generator

Figure 22:
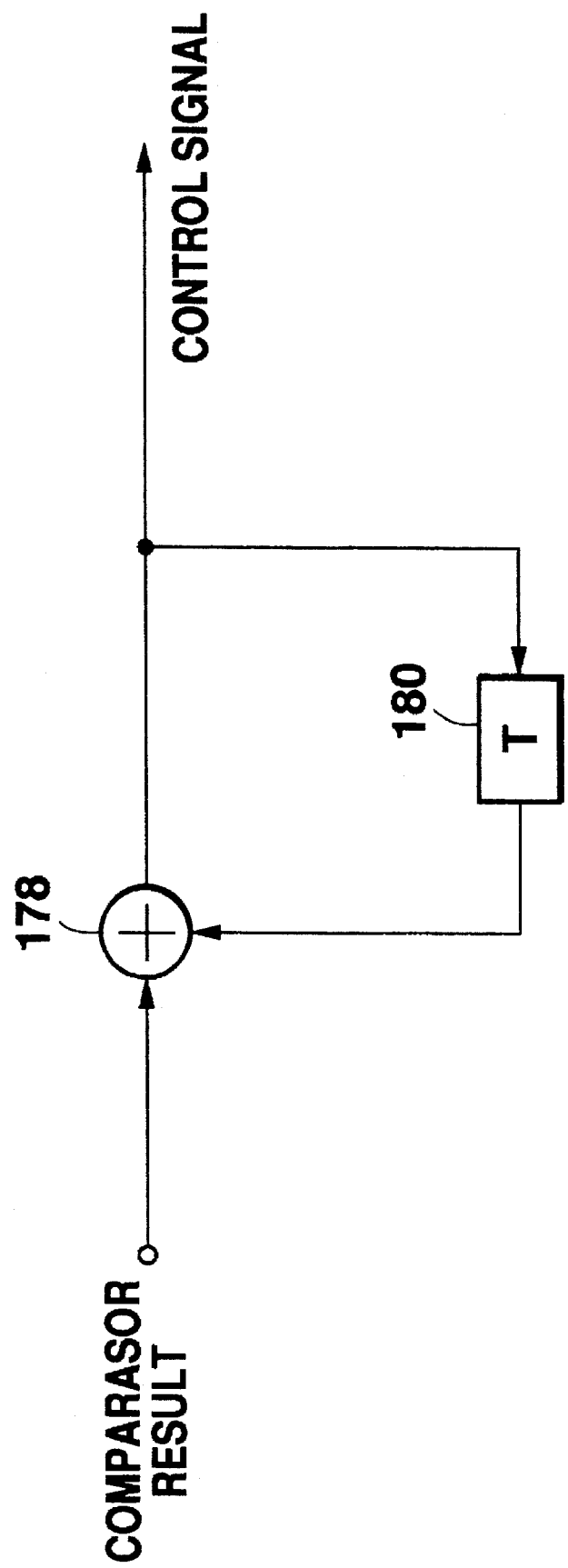
FIG. 22 is a block diagram of another example of the structure of the control signal generator.

FIG. 22 shows an alternative structure of the control signal generator 112. When using the circuit shown in FIG. 16, as the comparator unit 172, the simplified first order IIR filter shown in FIG. 22 may be used as the control signal generator 112.

The circuit shown in FIG. 22 comprised an adder element 178 and a delay element 180. The output $C_i$ of the comparator unit 172 is input to one terminal of the adder element 178 and the output of the adder element 178 is fed back through the delay element 180 whose delay time is equal to the sampling period T. Therefore, the output of this circuit can be represented as $O_i + C_i + O_{i-1}$. By considering that $C_{i-1} = O_{i-1}$, the output $O_i$ can be rewritten as:

$$O_i = \sum_{j=1}^{i} C_j$$

Hence, the control signal generator 112 shown in FIG. 22 operates as an integrator, and so the automatic gain control can be realized by using the output $O_i$ as the control signal for the variable gain amplifier 106. In addition, the transmission power control and the antenna azimuth control can be realized by using the output $O_i$ in the channel supervisor 118 and the direction controller 120.

Figure 23:
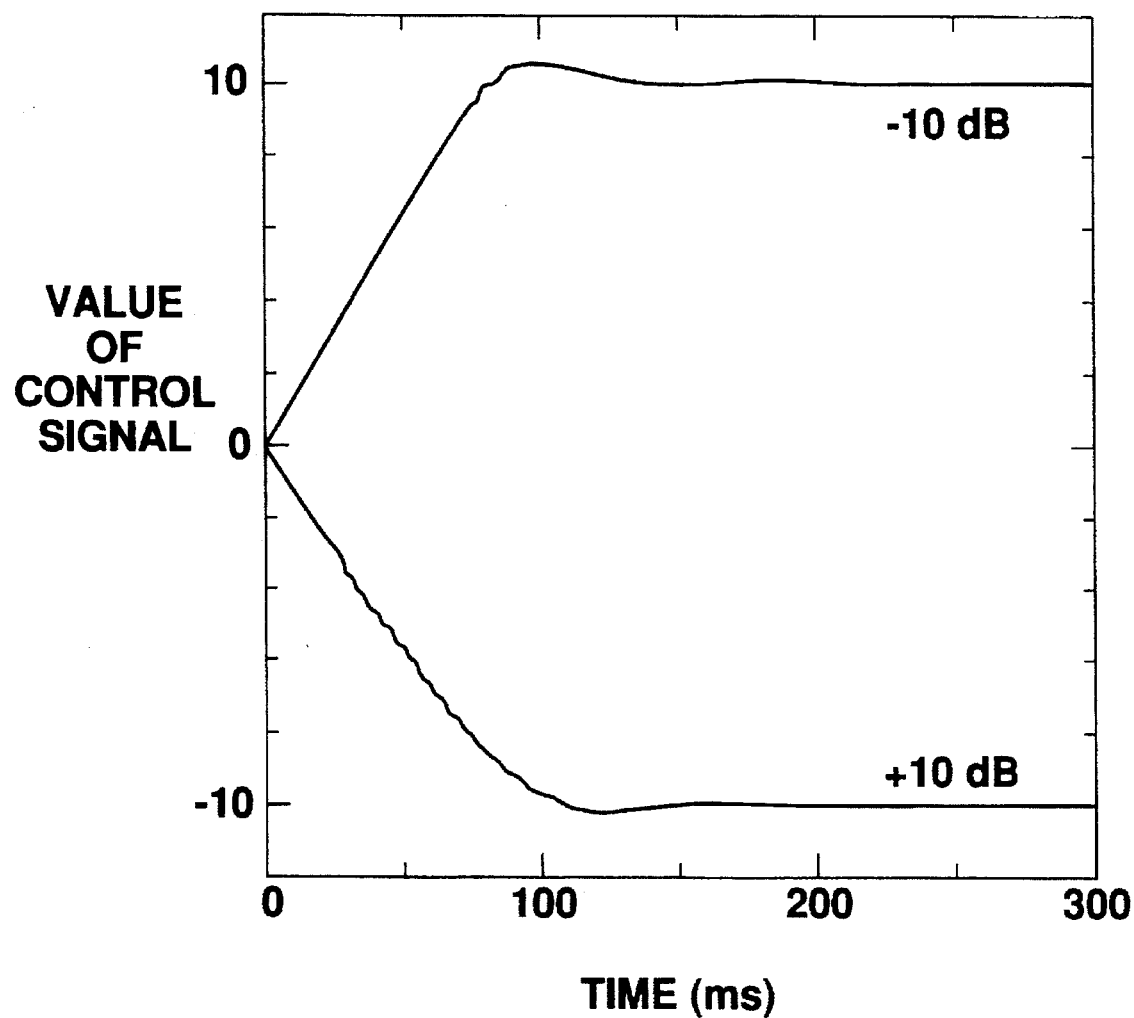
FIG. 23 shows the pull-in characteristics when the circuits shown in FIGS. 16 and 22 are used.

FIG. 23 shows the pull-in characteristics when the circuit shown in FIG. 16 and FIG. 22 are used. As is apparent from the figure, regardless of the polarity ("+" or "−") of the initial deviation, equal pull-in time is obtained.

b.7) Channel Supervisor

Figure 24:
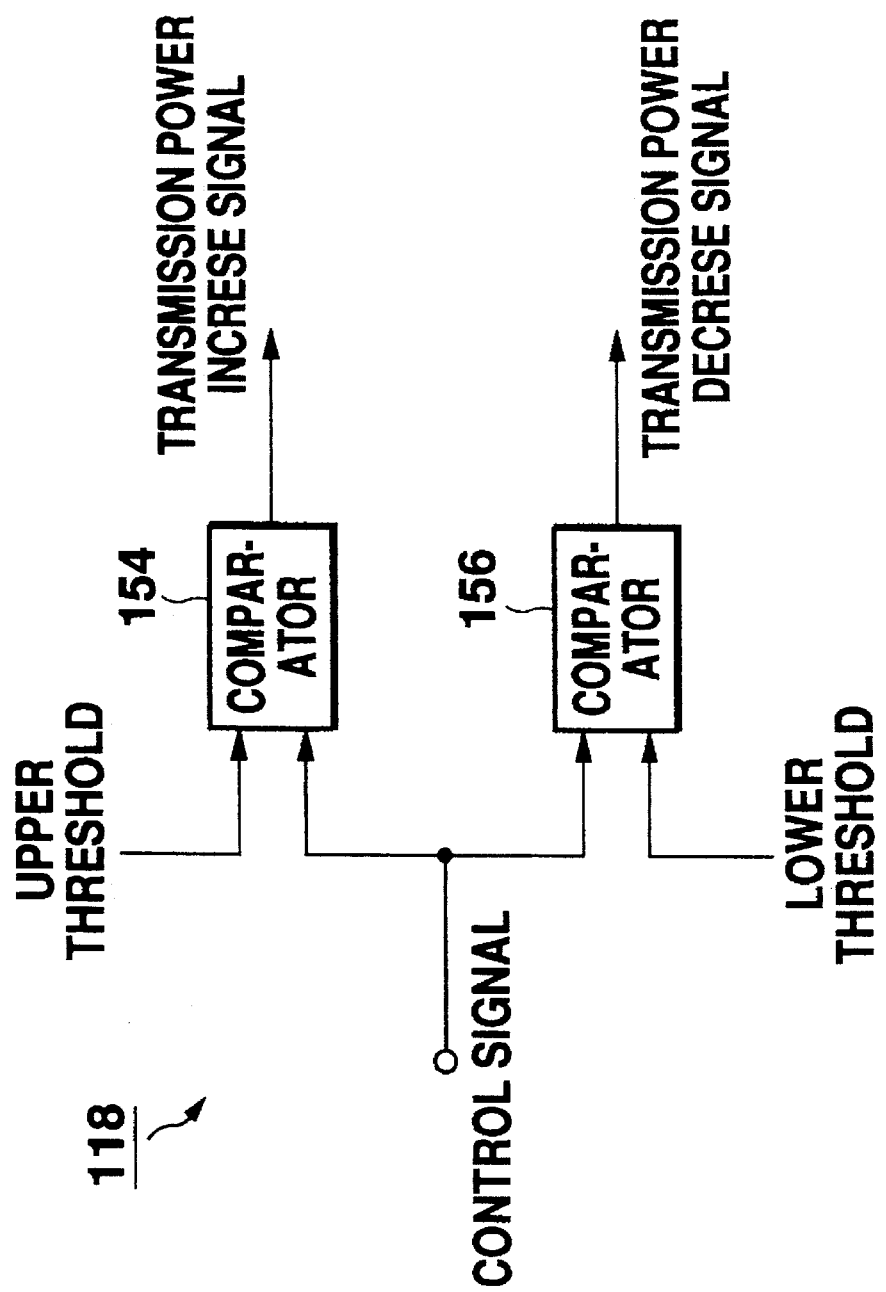
FIG. 24 is a block diagram of the structure of a channel supervisor.

FIG. 24 shows an example of the structure of the channel supervisor 118. The channel supervisor 118 is composed of comparators 154 and 156. The comparators 154 and 156 compare the value of the control signal with an upper threshold $rth_u$ and a lower threshold $rth_l$. The comparators 154 and 156 supply a transmission power increase signal and a transmission power decrease signal to a transmitter when the value of the control signal is larger than the upper threshold $rth_u$ and when the control signal is smaller than the lower threshold $rth_l$, respectively. These signals may be supplied to the transmitter by using either a wire circuit or a radio circuit. The transmitter increases or decreases the transmission power in accordance with the transmission power increase signal and the transmission power decrease signal.

b.8) Direction Controller

Figure 25:
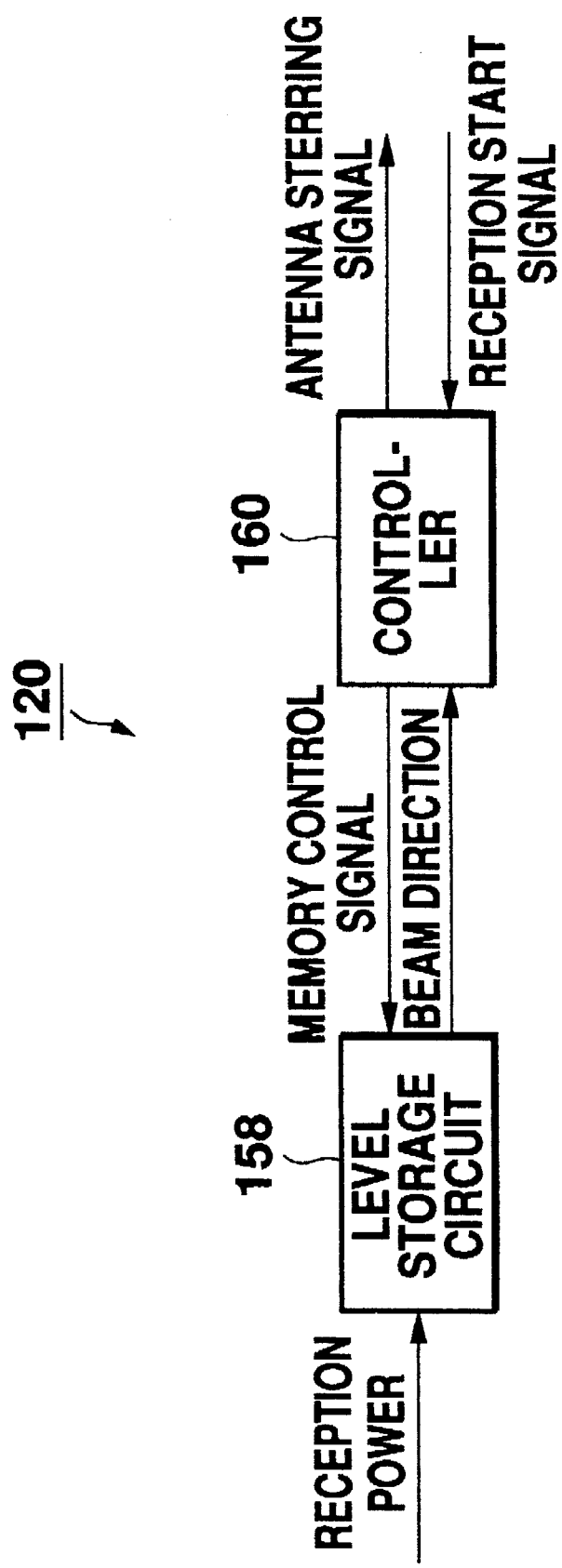
FIG. 25 is a block diagram of the structure of a direction controller.

FIG. 25 shows an example of the structure of the direction controller 120. The direction controller 120 is composed of a level storage circuit 158 and a controller 160. When a signal indicating that reception has started is supplied from a circuit (not shown) in the receiver, the controller 160 instructs the antenna 100 to execute round scan and supplies an antenna steering signal to the antenna 100 so as to mechanically steer the antenna 100 or electronically switch the beam direction, thereby controlling the beam direction of the antenna 100. The target direction, namely, the direction in which the reception power is at its maximum is read from the level storage circuit 158.

The level storage circuit 158 is a memory which stores the reception power in correspondence with the beam direction. While the antenna 100 is executing round scan under the control of the controller 160, the level storage circuit 158 stores the value of the control signal generated by the control signal generator 112 in accordance with the memory control signal which is supplied from the controller 160 in correspondence with the beam direction of the antenna 100 at that time. When the round scan is finished and the ordinary control is started, the controller 160 judges which direction beam the maximum reception power of the reception powers stored in the level storage circuit 158 corresponds to, and reads this direction beam as the control target of the antenna 100. By this operation, it is possible to direct the antenna 100 to the optimum direction.

b.9) Variable Gain Amplifier

Figure 26:
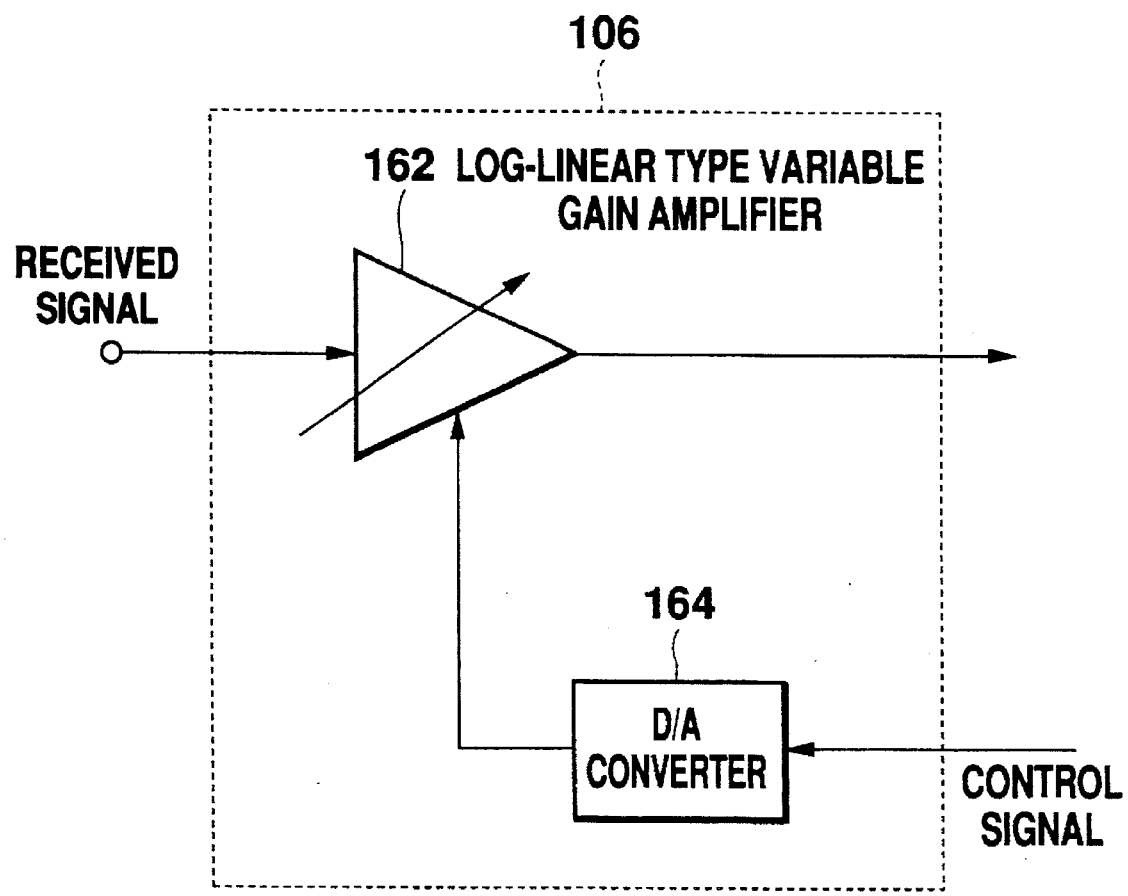
FIG. 26 is a block diagram of an example of the structure of a variable gain amplifier.
Figure 27:
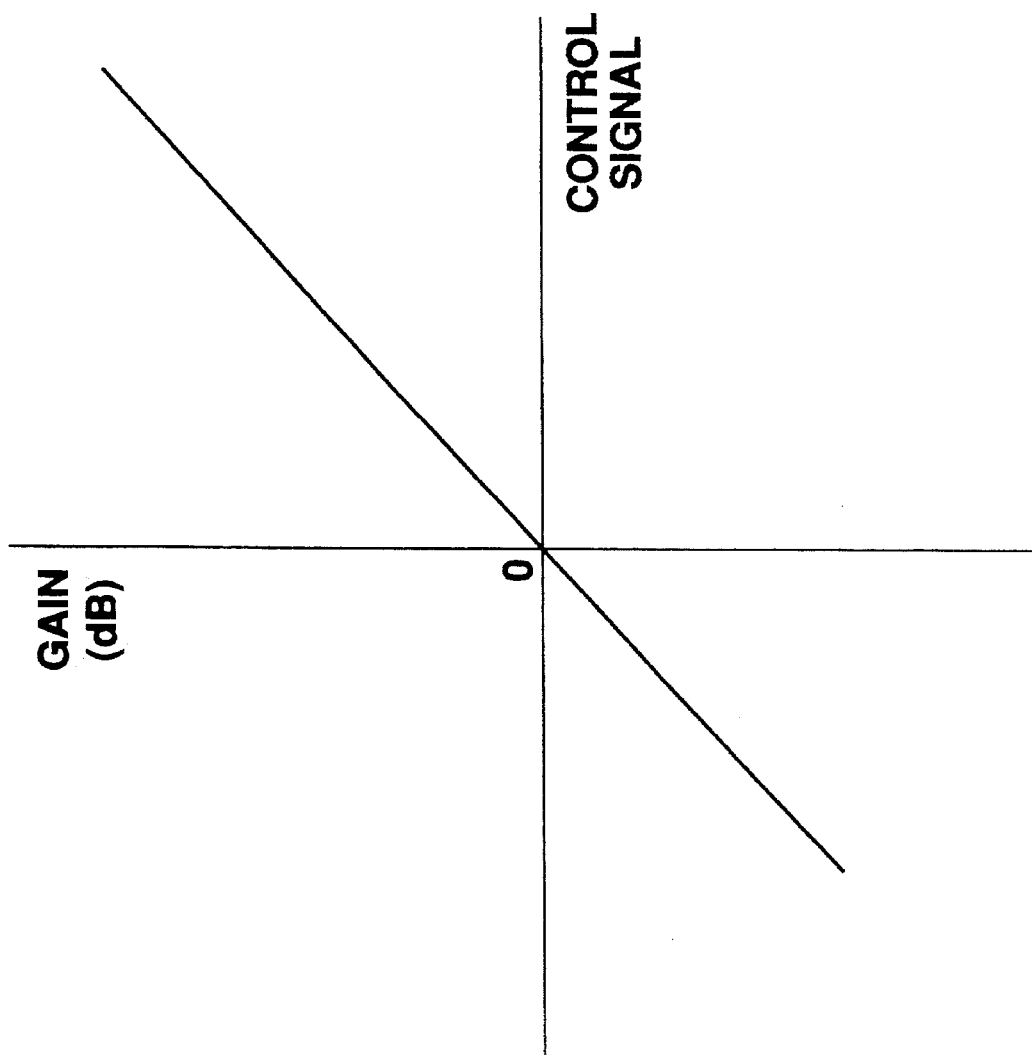
FIG. 27 shows the characteristics of a log-linear variable gain amplifier.
Figure 28:
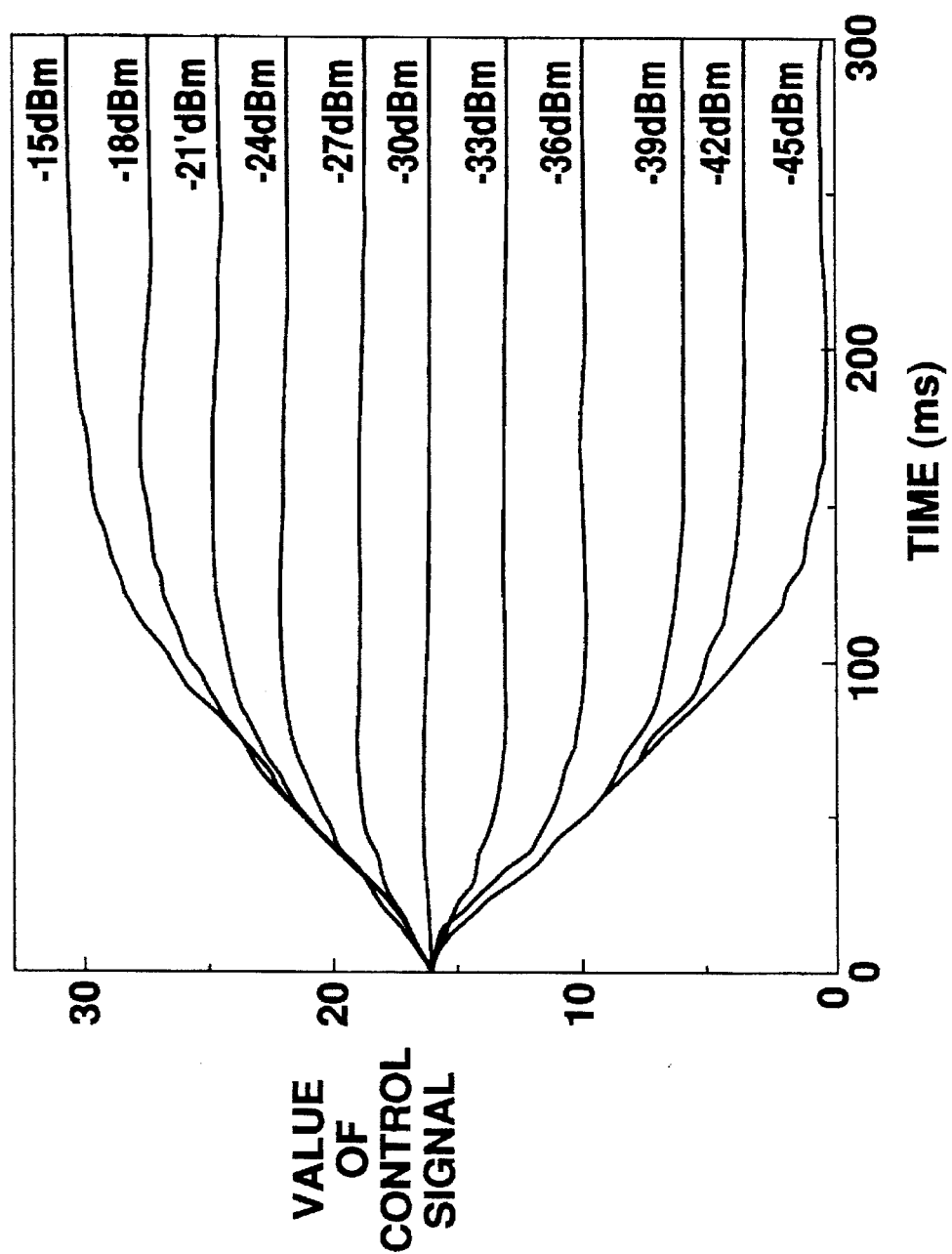
FIG. 28 shows the response of a control signal to the power input to the variable gain amplifier.

FIG. 26 shows an example of the structure of the variable gain amplifier 106. The variable gain amplifier 106 is composed of a log-linear type variable gain amplifier 162 which has a log-linear characteristic such as that shown in FIG. 27, (i.e., that the control signal is proportional to the gain represented by dB) and a D/A converter 164 which converts the control signal to an analog signal and supplies it to the log-linear type variable gain amplifier 162. If it is assumed that the dynamic range of the control signal is 5 bits, that the control target of the reception power is −30 dBm and that the value of the control signal when the reception power is coincident with the control target is 16, the response of the control signal to the input power to the log-linear type variable gain amplifier 162 is such as that shown in FIG. 28.

Figure 29:
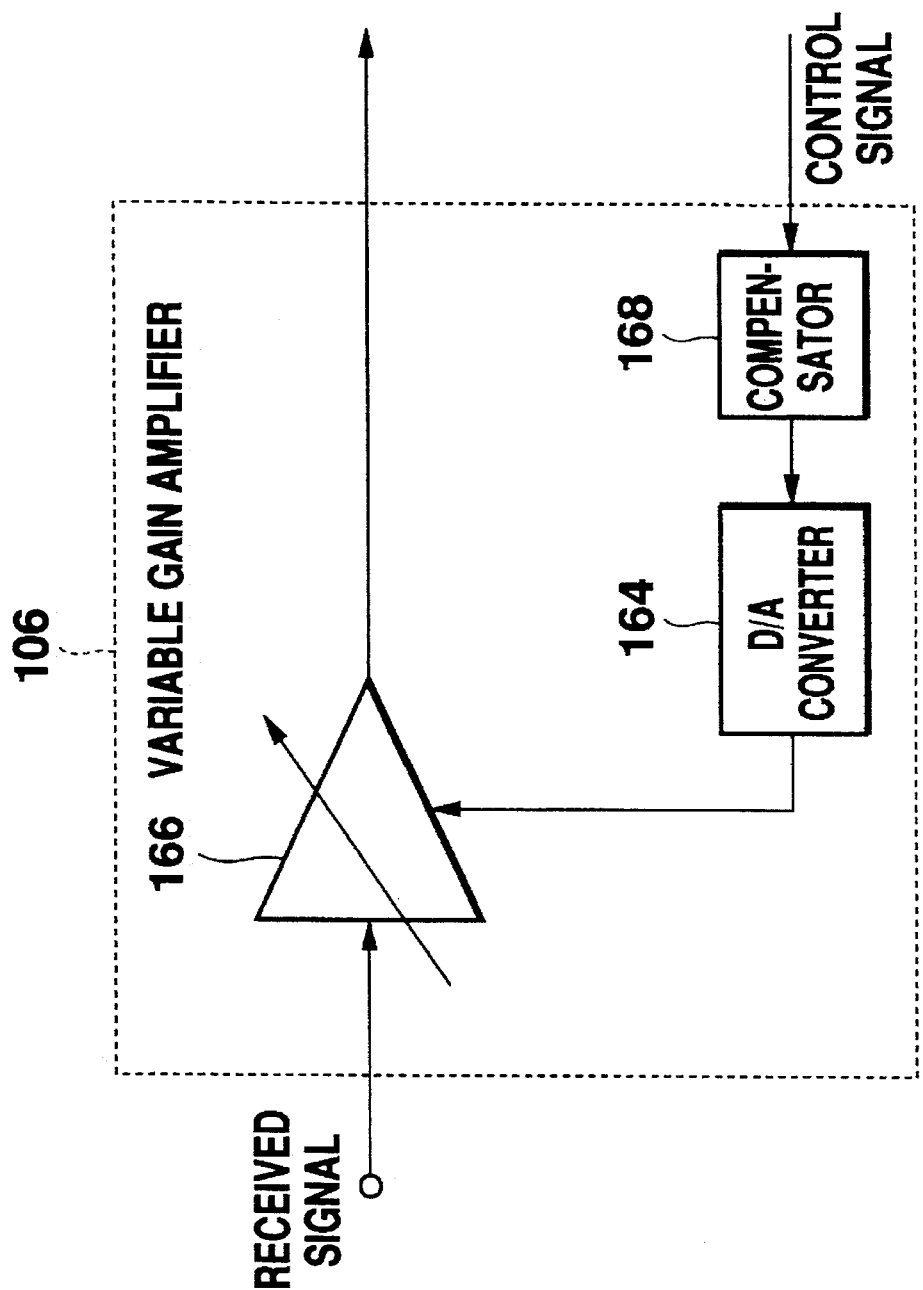
FIG. 29 is a block diagram of another example of the structure the variable gain amplifier.
Figure 30:
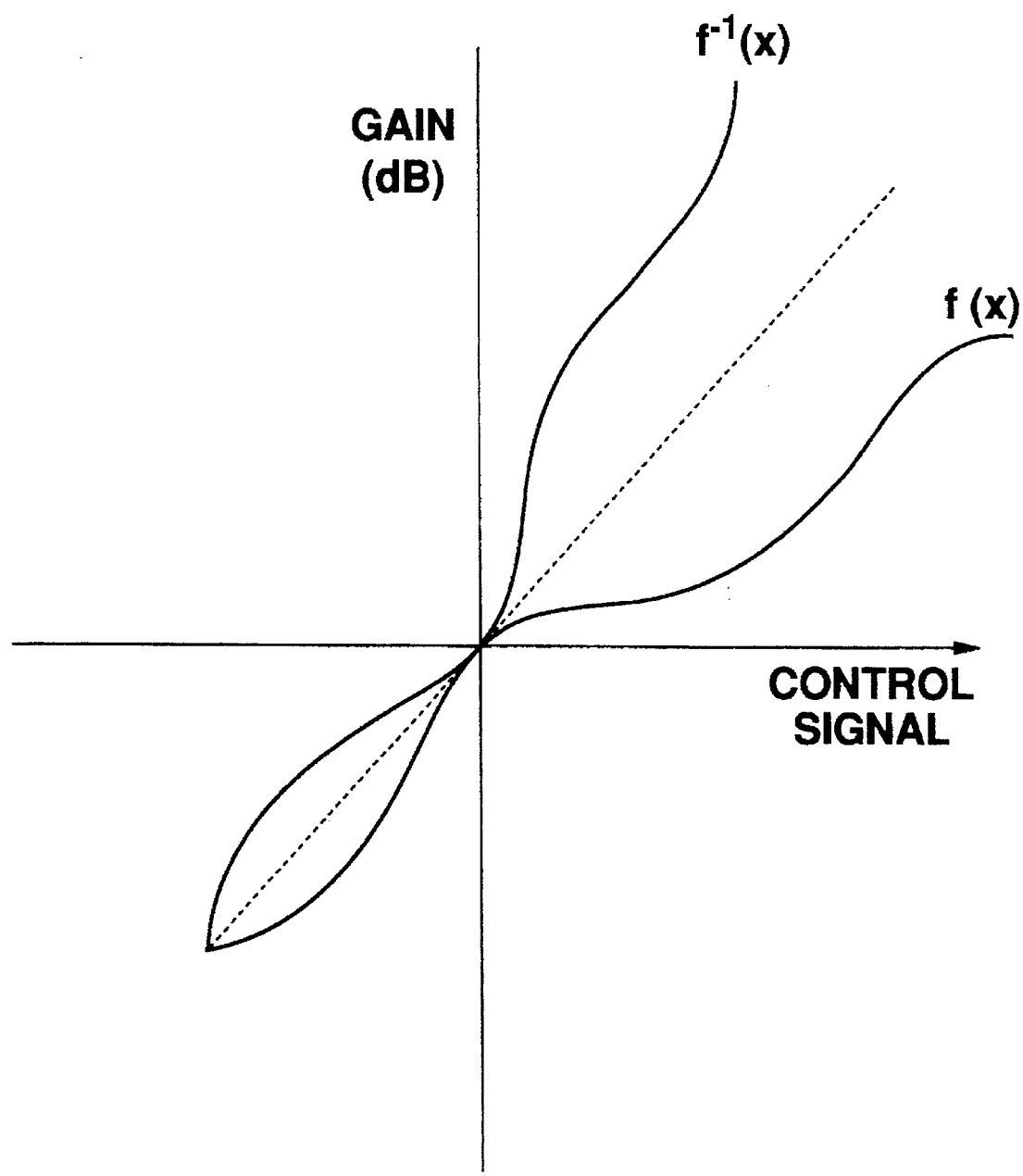
FIG. 30 shows the characteristics of a compensator.

FIG. 29 shows another example of the structure of the variable gain amplifier 106. The variable gain amplifier shown in FIG. 29 is composed of a variable gain amplifier 166, the D/A converter 164 and a compensator 168. The control signal supplied from the control signal generator 112 is corrected by the compensator 168, converted into an analog signal by the D/A converter 164, and is used for controlling the gain of the variable gain amplifier 166. The compensator 168 corrects the control signal by compensating the deviation of the characteristic of the variable gain amplifier 166 from the log-linear characteristic. If the characteristic of the variable gain amplifier 166 is the characteristic represented by the function f(x) in FIG. 30, in order to realize the log-linear characteristic represented by the broken line in FIG. 30, the control signal supplied to the variable gain amplifier 166 is provided in advance with the characteristic represented by the reversed function $f^{-1}(x)$. In this manner, it is possible to produce a similar effect to that of the log-linear variable gain amplifier 162 by using the cheap variable gain amplifier 166 of a conventional type, which leads to a reduction in cost.

Figure 31:
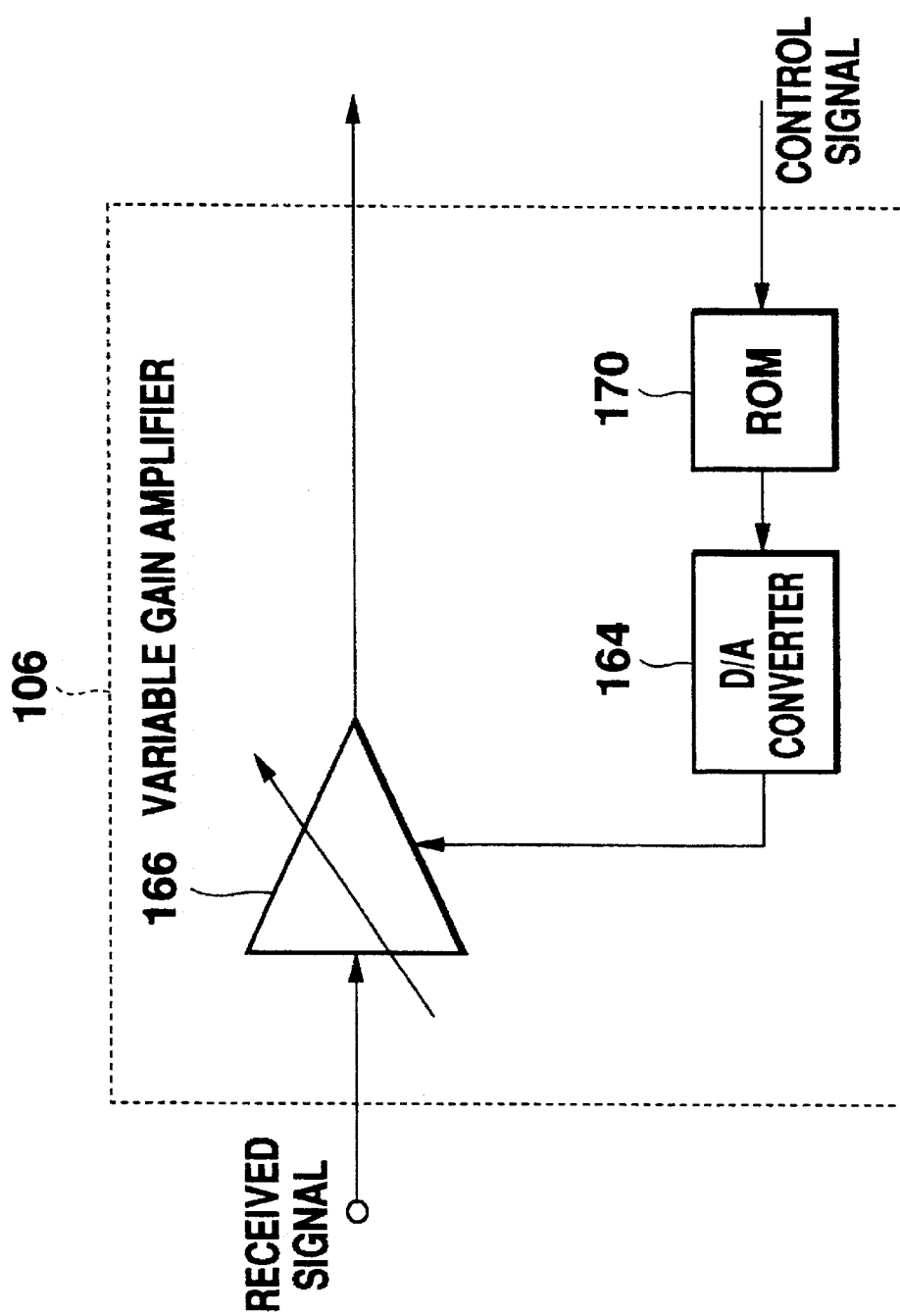
FIG. 31 is a block diagram of still another example of the structure the variable gain amplifier.
Figure 32:
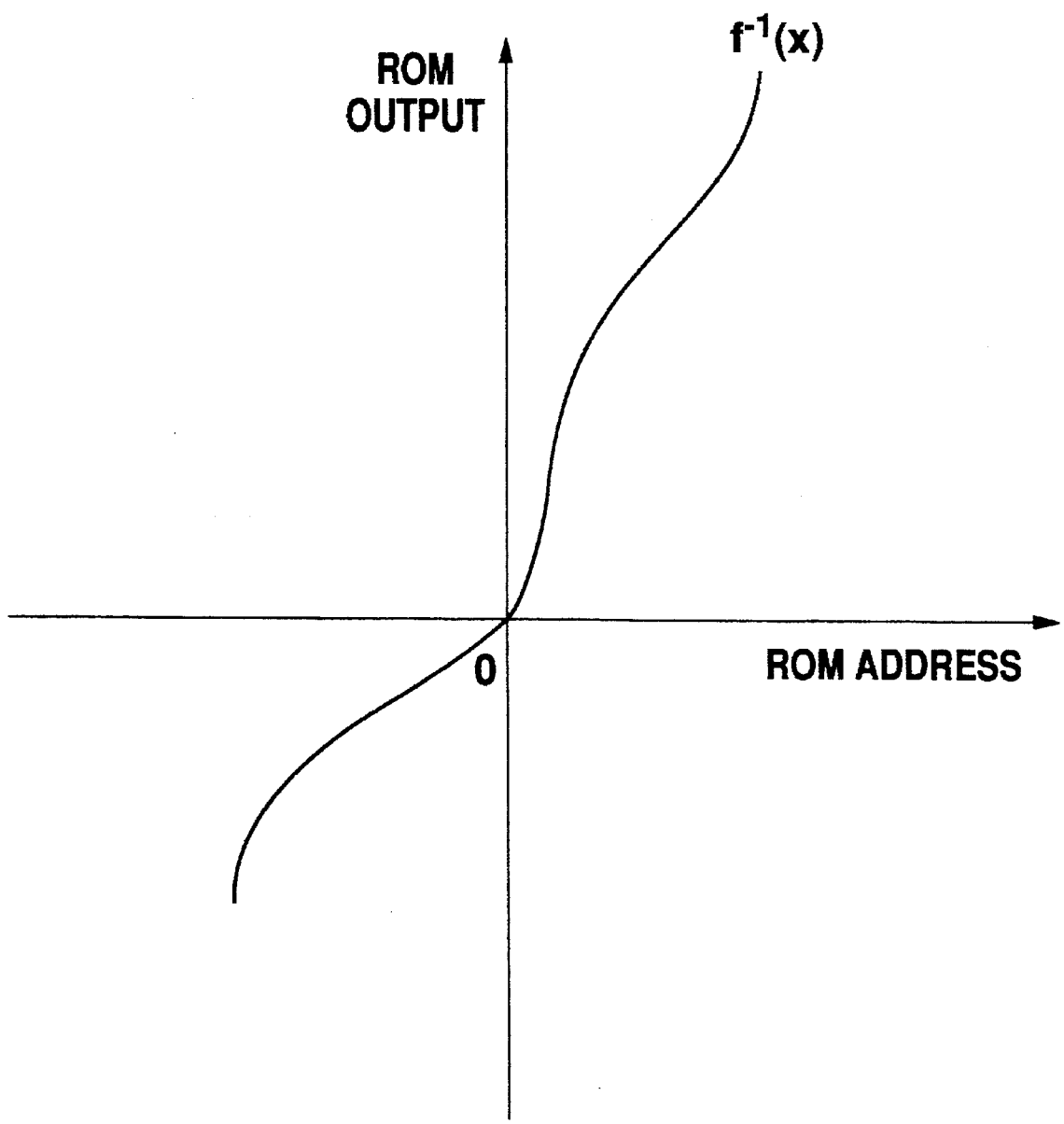
FIG. 32 shows the contents of a ROM.
Figure 33:
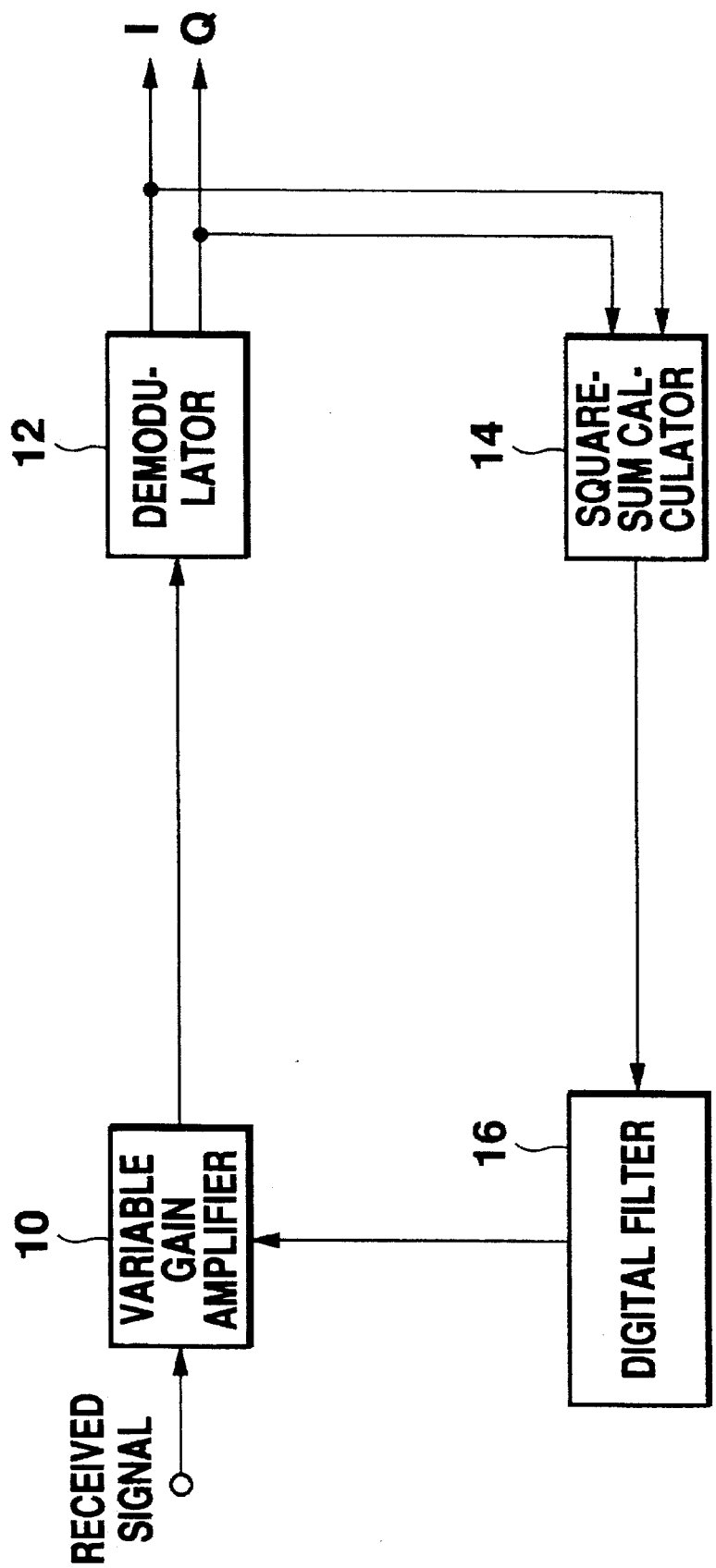
FIG. 33 is a block diagram of the structure of a conventional receiver.
Figure 34:
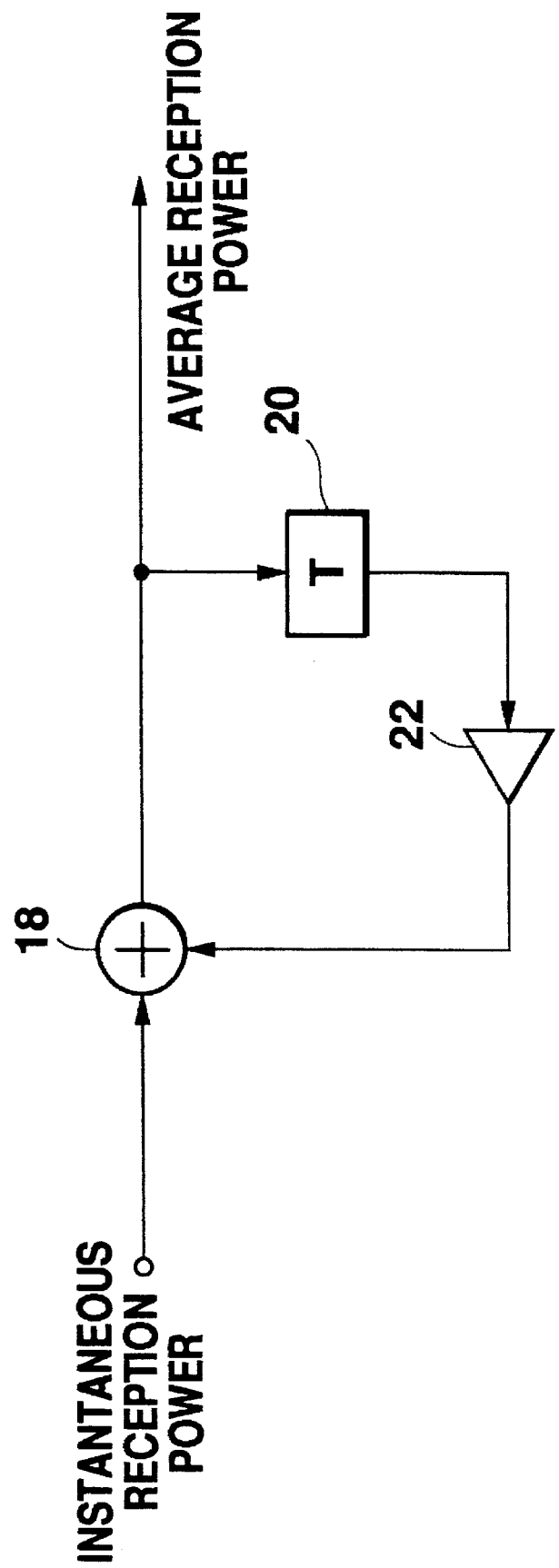
FIG. 34 shows an example of the structure of a digital filter.
Figure 35:
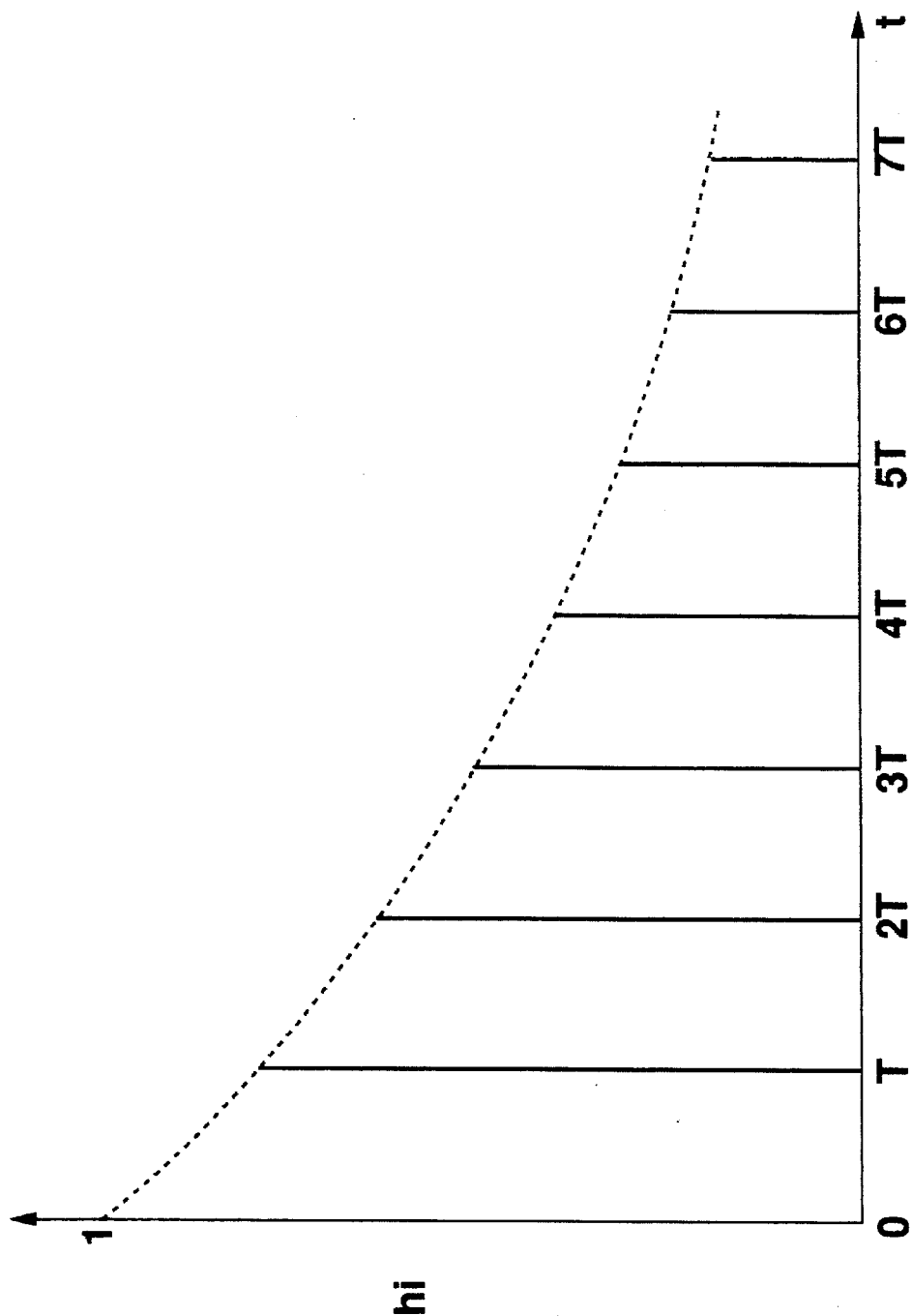
FIG. 35 shows the unit impulse response of the digital filter shown in FIG. 24.
Figure 36:
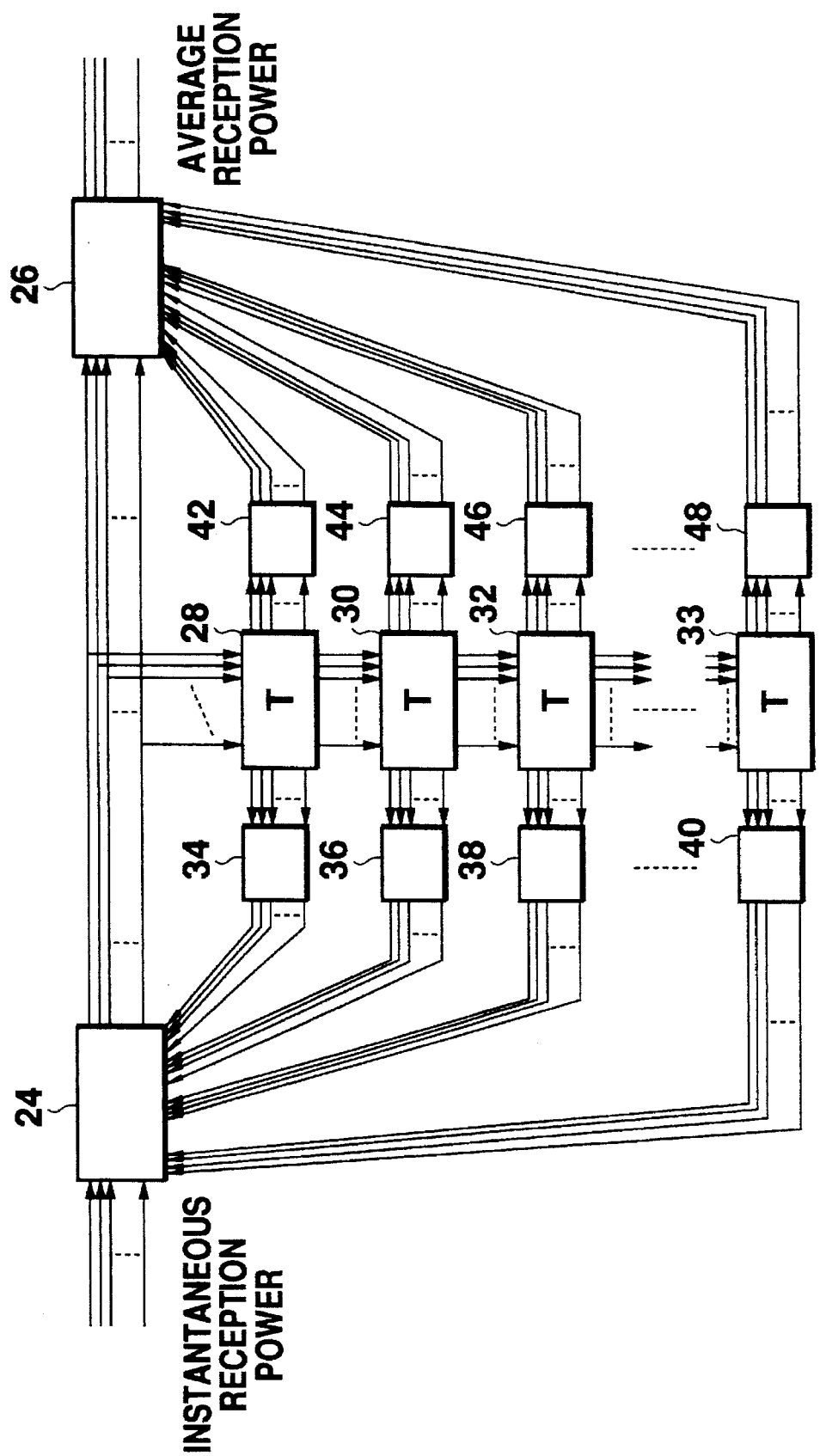
FIG. 36 shows another example of the structure of the digital filter.
Figure 37:
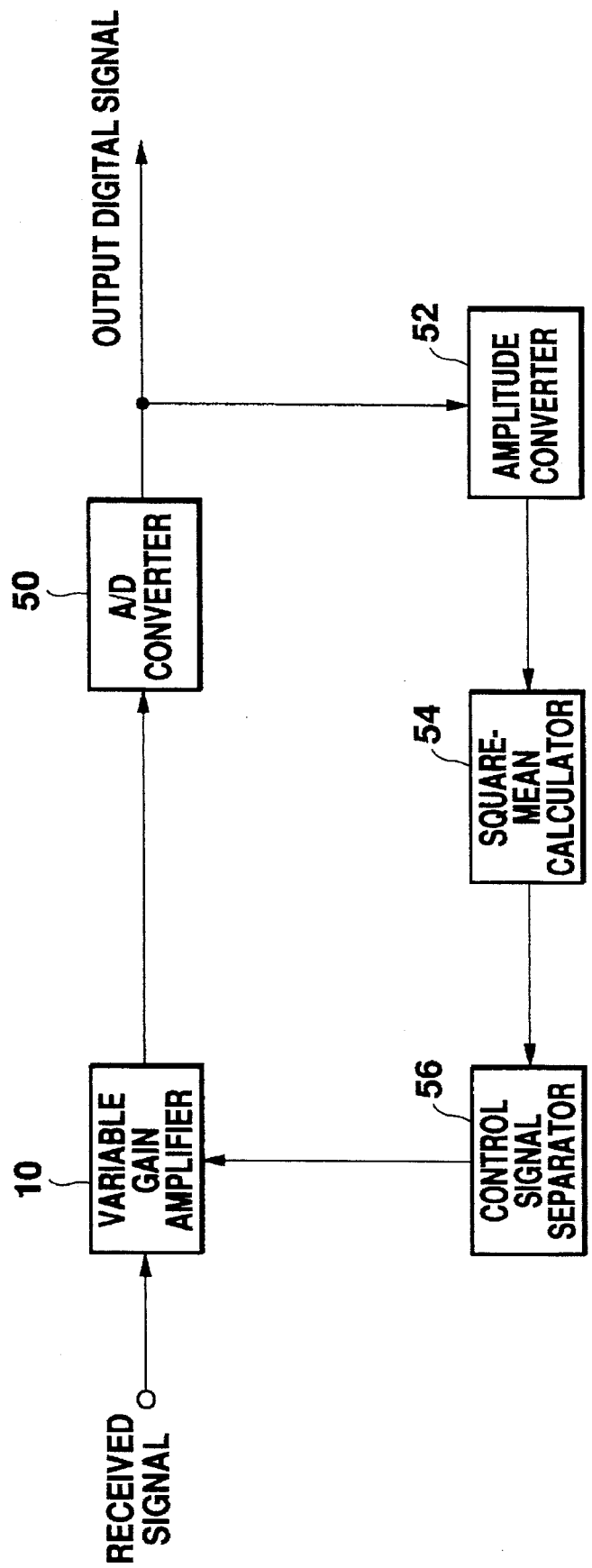
FIG. 37 is a block diagram of the structure of another conventional receiver.

FIG. 31 shows still another example of the structure of the variable gain amplifier 106. The variable gain amplifier shown in FIG. 31 is composed of the variable gain amplifier 166, the D/A converter 164 and a ROM 170. The ROM 170 is an example of the compensator 168 shown in FIG. 29. The control signal $f^{-1}(x)$ is stored at the address x of the ROM 170, as shown in FIG. 32. It is therefore possible to read the control signal $f^{-1}(x)$ after compensation from the ROM 170 by using the control signal supplied from the control signal generator 112 as the address x. By adopting this structure, it is possible to realize the compensator 168 with a simple structure and at a low cost.

c) Supplement

In the above explanation, the structure for controlling the gain of an intermediate frequency amplifier with a channel supervisor and a direction controller added thereto is shown, but the present invention is also applicable to the structure for controlling the gain of a radio frequency amplifier with a channel supervisor and a direction controller added thereto. The latter structure will be readily conceived by those skilled in the art by reference to the specification and the drawings of the present invention.

In addition, although the structure having only one stage of an intermediate frequency is shown in the above embodiments, the present invention is also applicable to the structure having a multiplicity of stages of intermediate frequency. This structure will also be readily conceived by those skilled in the art by reference to the specification and the drawings of the present invention.

In the above explanation, the power is detected from the received signal having an intermediate frequency, but it may be detected from the output of the demodulator.

In addition, although QPSK, QAM, etc. are described as the system in which the envelope level fluctuates, the present invention is applicable to other modulation systems having a similar property. The modification of the circuit structure which will be necessary for this purpose will also be easy by reference to the specification and the drawings of the present invention. The control object may be a variable attenuator in place of the variable gain amplifier.

While there has been described what are at present considered to be preferred embodiments of the invention, it will be understood that various modifications may be made thereto, and it is intended that the appended claims cover all such modifications as fall within the true spirit and scope of the invention.

What is claimed is:

1. A control signal generator for controlling one of a gain of a gain controllable device, a power of a signal to be transmitted at a transmitter, or a beam direction of an antenna, based upon an instantaneous power of a received signal, said control signal generator comprising:

random walk filtering means for random walk filtering said instantaneous power, said random walk filtering means including:

integrating means producing an integrated power value by integrating a unit value representing said instantaneous power relative to a predetermined threshold value; and smoothing means forcibly resetting said integrated power value to a reference value between a predetermined upper threshold, and a predetermined lower threshold smaller than said upper threshold, when the integrated power value reaches said upper threshold and said lower threshold so that there is no fluctuation in said integrated power value beyond a predetermined range; and means for obtaining a trend of change of said instantaneous power on the basis of a result of the random walk filtering, and controlling the one of the gain of the gain controllable device, the power to be transmitted, and the beam direction of an antenna in accordance with said trend of change obtained.

2. A control signal generator as claimed in claim 1, further including:

comparing means for comparing the instantaneous power with a plurality of thresholds which are set so that a plurality of sub-ranges, each having a predetermined equal range on a log scale, are provided;

decoding means for generating a sub-range signal indicative of one of the plurality of subranges to which the instantaneous power belongs, in accordance with a result of comparison;

integrating means for producing an integrated power value by integrating the sub-range signal; and controlling means for controlling the one of the gain of said gain controllable device, the transmission power, and the azimuth of the antenna in accordance with the integrated power; said controlling means obtaining said trend of change of said instantaneous power by detecting that said integrated power value has reached said upper threshold or said lower threshold.

3. A control signal generator as claimed in claim 1, wherein the integrating means includes a first order infinite impulse response filter.

4. An automatic gain controller for controlling one of a gain of a gain controllable device, a power of a signal to be transmitted at a transmitter, or a beam direction of an antenna, a received automatic gain controller comprising:

power detecting means for detecting an instantaneous power of said signal amplified or attenuated by said gain controllable device; and a control signal generator including:

a means for random walk filtering said instantaneous power, said means including:

integrating means producing an integrated power value by integrating a unit value representing said instantaneous power relative to a predetermined threshold value; and smoothing means for forcibly resetting said integrated power value to a reference value between a predetermined upper threshold, and a predetermined lower threshold smaller than said upper threshold, when the integrated power value reaches said upper threshold and said lower threshold so that there is no fluctuation in said integrated power value beyond a predetermined range; and a controlling means for obtaining a trend of change of said instantaneous power on the basis of a result of the random walk filtering by detecting a number of times that said integrated power value has reached said upper threshold or said lower threshold, said controlling means controlling the one of the gain of the gain controllable device, the power to be transmitted, and the beam direction of an antenna in accordance with said trend of change obtained.

5. An automatic gain controller to claim 4, further comprising power quantizing means for providing a quantized instantaneous power for quantizing said instantaneous power and supplying the quantized instantaneous power to said integrating means, wherein said power detecting means includes:

means for converting said signal amplified or attenuated by said gain controllable device into a digital value; and means for obtaining said instantaneous power by squaring said digital value.

6. An automatic gain controller according to claim 5, wherein said power quantizing means includes a comparator for quantizing said instantaneous power by a single threshold and supplying the quantized instantaneous power to said integrating means; and said integrating means includes an up-down counter for counting up or counting down in accordance with a sign of said quantized instantaneous power and supplying a count value obtained to said smoothing means, as said integrated power value.

7. An automatic gain controller according to claim 6, wherein said single threshold is so set as to make a change in said integrated power value with a change in said instantaneous power, relative to said predetermined threshold, small.

8. An automatic gain controller according to claim 5, wherein said power quantizing means includes dead zone providing means for quantizing said instantaneous power by a plurality of thresholds having different values and supplying quantized instantaneous power to said integrating means.

9. An automatic gain controller according to claim 8, wherein said plurality of thresholds include first and second thresholds;

said dead zone providing means includes:

a first comparator for quantizing said instantaneous power by the first threshold; and a second comparator for quantizing said instantaneous power by the second threshold which is smaller than said first threshold; and said integrating means includes an up-down counter for counting up in accordance with the instantaneous power quantized by said first comparator, while counting down in accordance with the instantaneous power quantized by said second comparator, and supplying a count value obtained to said smoothing means as said integrated power value.

10. An automatic gain controller according to claim 5, wherein said power quantizing means includes dynamic range dividing means, the dynamic range dividing means includes means for comparing said instantaneous power with a plurality of thresholds which are set so that a plurality of subranges each having a predetermined equal range on a log-scale are provided, means for generating a sub-range signal indicative of one of the plurality of subranges to which the instantaneous power belongs, in accordance with a result of comparison, and means for supplying the sub-range signal to the integrating means as the quantized instantaneous power.

11. An automatic gain controller according to claim 4, further comprising power quantizing means for providing a quantized instantaneous power by quantizing said instantaneous power and supplying the quantized instantaneous power to said integrating means, wherein said power detecting means includes:

means for squaring said signal amplified or attenuated by said gain controllable device; and means for obtaining said instantaneous power by converting the signal squared by the squaring means into a digital value.

12. An automatic gain controller according to claim 4, further comprising power quantizing means for quantizing said instantaneous power by comparing said instantaneous power with a predetermined analog value and supplying the quantized instantaneous power to said integrating means for the quantizing, wherein said power detecting means includes:

square-law detecting means for detecting said signal amplified by said gain controllable device in accordance with a square law; and means for obtaining said instantaneous power by analog-integrating a signal detected by a square-law detecting means.

13. An automatic gain controller according to claim 4, wherein said smoothing means includes:

a third comparator for comparing said upper threshold with Said integrated power value;

a fourth comparator for comparing said lower threshold with said integrated power value; and means for forcibly setting said integrated power value at said reference value when said integrated power value is judged to exceed said upper threshold or to be lower than said lower threshold as a result of comparison; and said controlling means includes an up-down counter for obtaining said trend of change in the form of a count value by counting up when said integrated power value is judged to exceed said upper threshold and counting down when said integrated power value is judged to be lower than said lower threshold.

14. An automatic gain controller according to claim 4, further comprising a response setting means for associative setting of said upper threshold, said lower threshold and said reference value.

15. An automatic gain controller according to claim 14, wherein said response setting means includes:

means for setting said reference value at a value of a response changeover signal;

means for setting said upper threshold at a value obtained by multiplying the value of said response changeover signal by a predetermined value; and means for setting said lower threshold at 0.

16. A reception power controller comprising a gain controllable device and an automatic gain controller for controlling one of a gain of the gain controllable device, a power of a signal to be transmitted at a transmitter, or a beam direction of an antenna, so that the reception power is constant, the automatic gain controller including:

a gain controllable device for amplifying or attenuating a received signal;

power detecting means for detecting an instantaneous power of said signal amplified or attenuated by said gain controllable device; and a control signal generator including:

a means for random walk filtering said instantaneous power, said means including:

integrating means for producing an immigrated power value by integrating a trait value representing said instantaneous power relative to a predetermined threshold value; and smoothing means for forcibly resetting said integrated power value to a reference value between a predetermined upper threshold and a predetermined lower threshold smaller than said upper threshold when said integrated power reaches the upper threshold or said lower threshold so that there is no fluctuation in said integrated power value beyond a predetermined range; and controlling means for obtaining a trend of change of said instantaneous power by detecting a number of times that said integrated power value has reached said upper threshold and said lower threshold and controlling the one of a gain of the gain controllable device, a power to be transmitted, or a beam direction of an antenna in accordance with said trend of change obtained.

17. A reception power controller according to claim 16, wherein said gain controllable device has log-linear control characteristics.

18. A reception power controller according to claim 16, further comprising a compensating means for correcting characteristics of the gain of said gain controllable device with respect to said trend of change obtained by said controlling means to log-linear characteristics by compensating a difference between said log-linear characteristics and control characteristics of said gain controllable device, wherein said gain controllable device has characteristics other than said log-linear characteristics.

19. A reception power controller according to claim 18, wherein said compensating means has means for storing said trend of change obtained by said controlling means and the difference between said log-linear characteristics and said control characteristics of said gain controllable device in correspondence with each other.

20. A reception power controller according to claim 16, further comprising compensating means for correcting characteristics of the gain of said gain controllable device with respect to said trend of change obtained by said controlling means to desired control characteristics by compensating a difference between said desired characteristics and control characteristics of said gain controllable device, wherein said gain controllable device has control characteristics other than said desired control characteristic.

21. A reception power controller according to claim 20, wherein said compensating means has means for storing said trend of change obtained by said controlling means and the difference between said desired characteristics and said control characteristics of said gain controllable device in correspondence with each other.

22. A receiver comprising: receiving means for receiving a signal modulated in accordance with a predetermined modulation system; power detecting means for detecting an instantaneous power of said signal amplified or attenuated and a control signal generator for controlling one of a gain of a gain controllable device, a power of a signal to be transmitted at a transmitter or a beam direction of an antenna, said control signal generator including:

means for random walk filtering said instantaneous power, said random walk filtering including:

integrating means for producing an integrated power value by integrating a unit value representing said instantaneous power relative to a predetermined threshold value; and smoothing means for forcibly resetting said integrated power value to a reference value between a predetermined upper threshold and a predetermined lower threshold smaller than said upper threshold, when said integrated power reaches said upper threshold and said lower threshold so that there is no fluctuation in said integrated power value beyond a predetermined range; and controlling means for obtaining a trend of change of said instantaneous power by detecting a number of times that said integrated power value has reached said upper threshold and said lower threshold and controlling the one of the gain of said gain controllable device, the power to be transmitted, or the beam direction of an antenna in correspondence with said trend of change obtained.

23. A receiver according to claim 22, further comprising power controlling means for amplifying or attenuating a received signal, said power controlling means including a plurality of cascaded amplifiers and a gain of one of said plurality of cascaded amplifiers is controlled in accordance with said trend of change obtained by said controlling means.

24. A receiver according to claim 23, wherein said power detecting means detects the instantaneous power of a signal which is output from one of said plurality of cascaded amplifiers.

25. A receiver according to claim 24, wherein an amplifier, the gain of which is to be controlled, is the same as an amplifier the instantaneous output power of which is to be detected.

26. A receiver according to claim 24, wherein an amplifier, the gain of which is to be controlled, is an amplifier at the preceding stage to an amplifier the instantaneous output power of which is to be detected.

27. A receiver according to claim 22, further comprising transmission power demanding means for demanding a transmitter to increase or reduce a power to be transmitted on the basis of said trend of change obtained by said controlling means so as to suppress a fluctuation in a power of the signal amplified by said amplifying means.

28. A receiver according to claim 27, wherein said transmission power demanding means includes:

means for demanding an increase in the power to be transmitted when said trend of change obtained by controlling means exceeds a third threshold; and means for demanding a reduction in the power to be transmitted when said trend of change obtained by said controlling means is below a fourth threshold.

29. A receiver according to claim 22, wherein said receiving means includes an antenna a beam direction of which is controllable; and said receiver further comprises direction controlling means for detecting said beam direction in which the power of the received signal is at its maximum by utilizing said trend of change obtained by said controlling means and controlling the beam direction of said antenna with the detected beam direction as a control target.

30. A receiver according to claim 22, wherein said direction controlling means includes:

means for collecting said trend of change obtained as the data indicating a power of the received signal in correspondence with the scanned beam direction by scanning the beam direction of said antenna in a predetermined angle range; and means for selecting the data on the beam direction in which the power of the received signal is at its maximum from collected data and controlling the beam direction of said antenna with selected data as a control target.

* * * * *